(12) United States Patent
Lee et al.

(10) Patent No.: US 6,692,996 B2
(45) Date of Patent: Feb. 17, 2004

(54) METHOD FOR CRYSTALLIZING SILICON LAYER

(75) Inventors: Seok Woon Lee, Incheon (KR); Seung Ki Joo, Seoul (KR)

(73) Assignee: PT Plus Co., Ltd., Seoul (KR)

( * ) Notice: Subject to any disclaimer, the term of this patent is extended or adjusted under 35 U.S.C. 154(b) by 0 days.

(21) Appl. No.: 09/826,438

(22) Filed: Apr. 4, 2001

(65) Prior Publication Data

US 2002/0058365 A1 May 16, 2002

(30) Foreign Application Priority Data

Nov. 11, 2000 (KR) .................................... 2000-0067018

(51) Int. Cl.[7] .............................................. H01L 21/00
(52) U.S. Cl. ........................................ 438/149; 438/166
(58) Field of Search ................................ 438/149–150, 438/166

(56) References Cited

U.S. PATENT DOCUMENTS

| | | | |
|---|---|---|---|
| 5,275,851 A | | 1/1994 | Fonash et al. .............. 427/578 |
| 5,403,772 A | * | 4/1995 | Zhang et al. ................... 117/8 |
| 5,426,064 A | | 6/1995 | Zhang et al. .................. 437/40 |
| 5,821,562 A | | 10/1998 | Makita et al. ................. 257/64 |
| 5,937,282 A | | 8/1999 | Nakajima et al. ............ 438/149 |
| 5,940,693 A | | 8/1999 | Maekawa ..................... 438/166 |
| 6,228,693 B1 | * | 5/2001 | Maekawa et al. ............ 438/166 |
| 6,346,437 B1 | * | 2/2002 | Maekawa et al. ............... 117/8 |

\* cited by examiner

Primary Examiner—Jey Tsai
(74) Attorney, Agent, or Firm—Baker Botts L.L.P.

(57) ABSTRACT

The present invention relates to a method for crystallizing the active layer of a thin film transistor utilizing crystal filtering technique. According to the conventional metal induced lateral crystallization (MILC) method, amorphous silicon layer can be crystallized into poly-crystal silicon layer. According the crystal filtering technique of the present invention, amorphous silicon layer can be single-crystallized by filtering a single crystal component from the poly-crystal region being crystallized by MILC. The TFT fabricated including an active layer crystallized according to the present method has significantly improved electrical characteristics such as electron mobility and leakage current as compared to the TFT including a poly-crystal silicon active layer made by conventional methods. The invention also provides various TFT fabrication methods applying the crystal filtering technique.

45 Claims, 30 Drawing Sheets

CRYSTALLIZATION BY MILC

MILC DIRECTION

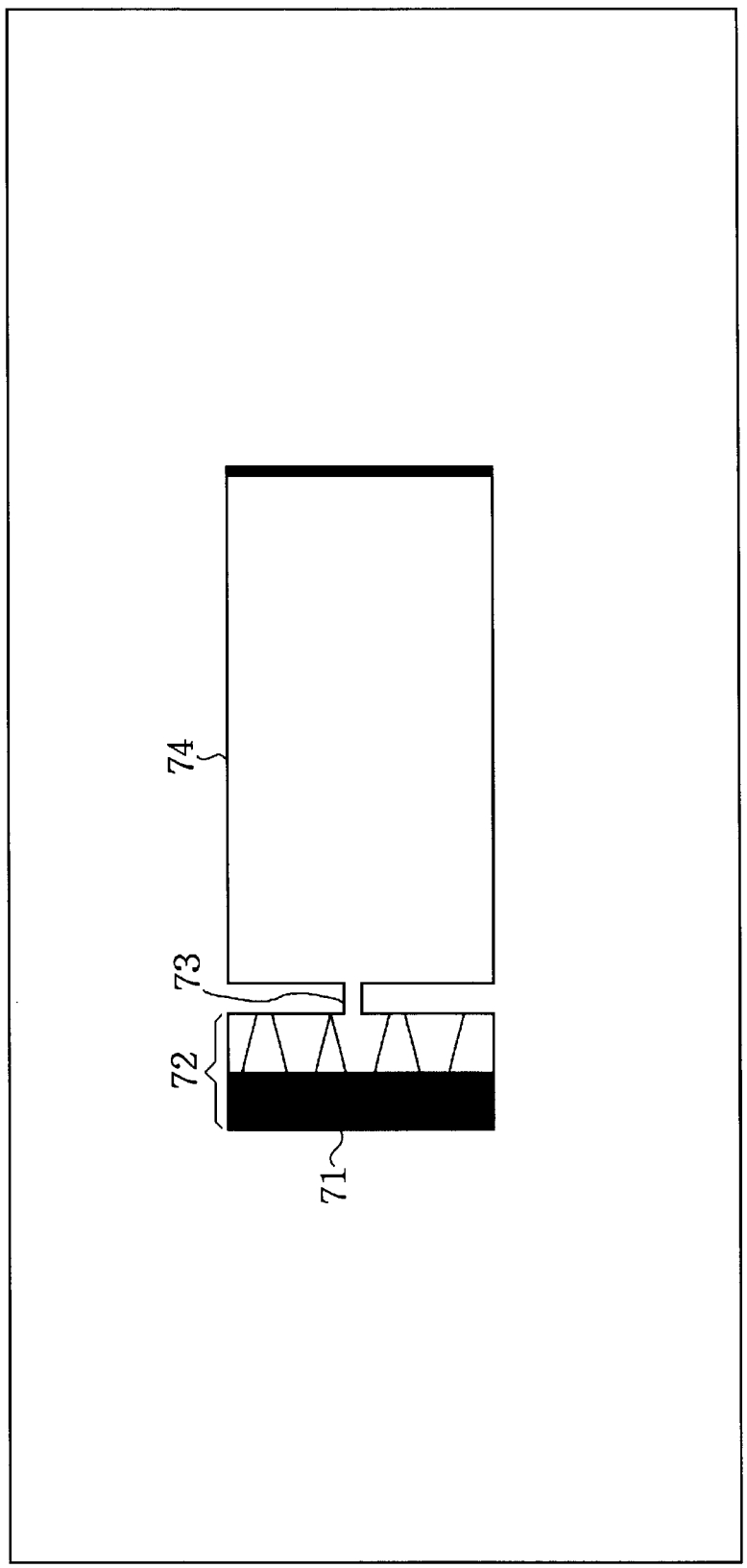

METHOD FOR CRYSTALLIZING SILICON LAYER

TECHNICAL FIELD

The present invention relates to a thin film transistor (TFT) that is used in liquid crystal display (LCD), organic light emitting diode (OLED) and 3-D integrated semiconductor device or the like, and more particularly to a method for crystallizing an active layer forming the source, drain and channel regions of a thin film transistor using crystal filtering technique.

BACKGROUND OF THE INVENTION

According to the present invention, the active layer of a thin film transistor can be crystallized into single crystalline silicon by filtering a crystal component having a uniform crystal orientation from a poly-crystal region which is crystallized by metal induced lateral crystallization (MILC) caused by MIC source metal.

Generally, the amorphous silicon transistor used in display devices such as LCD and OLED is fabricated by forming a gate electrode on a transparent substrate of glass or quartz, depositing gate oxide film, depositing amorphous silicon and n-type amorphous silicon, forming source and drain regions, and then forming an insulating layer. Generally, the active layer constituting the source, drain and channel regions of a thin film transistor is formed on a substrate such as glass or quartz using chemical vapor deposition (CVD) method. Since the active layer formed by CVD is made of amorphous silicon, it has low electron mobility of 1 $cm^2$/Vs or less. As the size of LCD using TFT is being miniaturized and its aperture ratio is being reduced, a technique that may simultaneously form the drive IC and the pixel transistor has been required. In order to do so, a technique of crystallizing an amorphous silicon layer into a poly-crystal silicon layer with thermal treatment is used.

A poly-crystal silicon layer transistor is formed by first depositing an amorphous silicon layer on a substrate of glass or quartz and the like, poly-crystallizing the silicon layer and forming a gate oxide film and a gate electrode, implanting dopant in the source and drain, activating the dopant through annealing, and finally forming an insulating layer. Generally, the electron mobility of poly-crystal silicon layer is in the range of ~100 $cm^2$/Vs. Thus, using the poly-crystal silicon, the drive IC of LCD may be integrated into the same substrate with the pixel transistors. The important factors that determine the characteristics of a poly-crystal TFT are the number and configuration of the crystal grains boundaries existing in the poly-crystal silicon. According to the number and configuration of the grain crystal boundaries in the poly-crystal silicon, the electron mobility and the threshold voltage of the poly-crystal thin film transistor vary significantly.

As a poly-crystal thin film transistor inevitably includes crystal grain boundaries in its active layer made of poly-crystal silicon, it has lower electron mobility as compared to the electron mobility of 800 $cm^2$/Vs of single crystalline silicon and higher degree of device non-uniformity. When fabricating a LCD using poly-crystal silicon layer transistors, the drive IC and the pixel transistor may be formed on the same substrate. However, due to the electron mobility of the poly-crystal silicon which is much lower than that of single crystal silicon, active elements such as the LCD controller, DAC, clock generator or the like may not be formed on the substrate. Also the increased device non-uniformity causes the deterioration of the display quality and the decreases of the productivity. Therefore, in order to secure uniform device characteristics equivalent to a single crystalline silicon device, some techniques for forming a single crystalline silicon layer with an amorphous silicon layer have been used.

A variety of methods for fabricating single crystalline silicon transistor have been proposed. Sequential lateral solidification (SLS) is a technique that forms single crystalline silicon in a local region while crystallizing an amorphous silicon layer by laser scanning using Chevron-type masks. The SLS method has a technical problem in precisely controlling the scanning of the laser beam. The method also has a limitation in obtaining single crystalline thin film having uniform characteristics because the crystal grains in the poly-crystal silicon frequently infiltrates into the locally formed single crystal silicon region. Also, as this method may process only one substrate at a time, the productivity of the process is lower than that of the batch process using a furnace.

Continuous grain solidification (CGS) is a technique that obtains crystallized silicon layer having substantially uniform crystal orientation by contacting or implanting metal such as nickel, palladium, aluminum and the like in amorphous silicon and crystallizing the amorphous silicon at a low temperature of 200~500° C. The CGS method has a disadvantage of requiring a gettering process, which involves an additional thermal treatment to remove the silicide component used as a catalyst for crystallizing the amorphous silicon. And, as the silicon layer formed by the CGS method is not essentially single crystalline, its electrical characteristics are inferior to those of a single crystal silicon film.

Recently, a method for crystallizing a silicon layer by using metal induced lateral crystallization (MILC) phenomenon was proposed. (See S. W. Lee et al., *IEEE Electron Device Letter*, 17(4), p.160, 1996) The MILC phenomenon induces successive crystallization of amorphous silicon layer as the silicide produced by the reaction of the metal and the amorphous silicon propagates in the lateral direction of the silicon layer. When the MILC method is used, as the metal component used to crystallize the amorphous silicon does not remain in the crystallized region, it avoids the problem that the metal component remaining in the crystallized silicon region causes leakage current and deteriorates other electrical characteristics. Also, when using the MILC method, as the crystallization of silicon layer is induced at relatively low temperature of 300~500° C., a plurality of substrates may be simultaneously crystallized in a furnace without causing damages to the substrates.

FIG. 1a to FIG. 1d are cross-sectional views illustrating the process of prior art for crystallizing a silicon layer constituting the active layer of a thin film transistor using MIC and MILC.

Referring to FIG. 1a, an amorphous silicon layer 10 is deposited on an insulating substrate 100 on which a buffer layer (not illustrated) is formed. Then the amorphous silicon layer 10 is patterned to form an active layer. A gate insulating layer 11 and a gate electrode 12 are formed on the active layer using conventional methods. As shown in FIG. 1b, a source region 10S and a drain region 10D are respectively formed in the active layer by doping impurity into the whole substrate using the gate electrode as a mask. As shown in FIG. 1c, photoresist 13 is formed to cover the gate electrode and the source and drain regions adjacent the gate electrode 12 and then a metal layer 14 is deposited on the entire surface of the photoresist 13 and the substrate. It is desirable that the metal layer is formed by depositing Ni at a thickness of about 20 Å. As shown in FIG. 1d, when performing thermal treatment of the entire substrate at temperature of 300° C. to 500° C. after removing the photoresist, the source and drain regions below the metal layer remaining after the removal of the photoresist is crystallized by metal induced crystallization (MIC) that directly crystallizes the silicon by the MIC source metal which is in contact with or implanted in the amorphous silicon. And the amorphous silicon in the metal offset region and in the channel region 10C beneath the gate electrode is crystallized by the MILC that propagates from the MIC region. As shown in FIG. 1a to FIG. 1d, the photoresist is formed to cover portions of the source and the drain regions on both sides of the gate electrode 12. It is because, if the metal layer 14 is deposited up to boundaries between the channel region and the source/drain regions, the metal component introduced into and remaining in the channel boundaries and in the channel region during the MIC adversely affects the operation characteristics and leakage current of the channel region.

As the operation of the source and the drain regions (except for the channel region) is not critically affected by the residual metal component, the source and the drain regions apart from the channel region over 0.01–5 μm are crystallized by the MIC and only the channel region and its peripheral regions are crystallized by the MILC. As a result, the time for crystallizing the entire amorphous silicon layer may be reduced.

FIG. 2a and FIG. 2b are electron microscope photographs of the crystalline structures of the silicon layer formed by conventional MIC and MILC methods. And FIG. 2c is a schematic diagram illustrating the crystallization state of the silicon layer in the photographs. The MIC region in which the metal catalyst exists is crystallized into polycrystal silicon. And the MILC region is crystallized to form polycrystal silicon including several crystal grain boundaries as shown in FIG. 2c. Meanwhile, as shown in FIG. 2b, the poly-crystal silicon region being crystallized by the MILC comprises a few crystal grains growing into the same direction. As the crystallized silicon layer constituting an active layer with a typical size of 2~20 μm generally includes one or more crystal grain boundaries, the electron mobility and the uniformity of the silicon layer are deteriorated. Therefore, in order to improve the performance of the thin film transistor including a poly-crystal active layer crystallized by MILC, a technique for crystallizing amorphous silicon into single crystalline silicon using MILC has been required.

SUMMARY OF THE INVENTION

To overcome the problems of the poly-crystal silicon produced by the conventional MILC method, the present invention provides a method for crystallizing amorphous silicon directly into single crystalline silicon using the MILC method. Specifically, the present invention provides a method for single-crystallizing amorphous silicon at a relatively low temperature by applying a crystal filtering technique to the MILC method.

In order to achieve these objects, the present invention forms a crystal seed at a desired region of a silicon layer on a substrate utilizing the MIC method, and grows crystal grains from the MIC crystal seed in the lateral direction utilizing the MILC method. Then the present invention filters the crystal grains being grown by the MILC and let some or one of the crystal grains continue to grow in the amorphous silicon region beyond the crystal filtering area. Thus, the amorphous silicon region beyond the crystal filtering area may be crystallized into single crystalline silicon as the filtered crystal grain (or grains) grows in the region by the MILC. Herein, the growth temperature of the crystal grain is typically limited to 650° C. or less to prevent the growth or generation of crystal grains outside of the MILC region being crystallized by the MILC. According to the present invention, a single crystalline silicon layer extending to tens to hundreds of μm may be obtained and the silicon layer thus obtained may be used to fabricate a semiconductor device such as TFT.

The present invention uses MIC source metal such as Ni to lower the crystallization temperature of amorphous silicon. In this connection, the present invention has an object to prevent the MIC source metal from affecting the performance of the semiconductor device by forming the single crystalline layer not in the MIC region where the MIC source metal resides but in the MILC region free of the MIC source metal. Also, the object of the present invention is to provide a thin film transistor comprising single crystalline silicon layer fabricated by the low-temperature crystallization method.

The present invention performs the crystallization of amorphous silicon layer at a temperature of 650° C. or less which is lower than the transformation temperature of glass. Thus, the method of the present invention may be used to fabricate semiconductor devices such as TFT on a substrate made of glass. Also, using the present invention, thin film transistors constituting the switching and driving elements of display devices such as LCD and OLED may be directly formed on the substrate.

FIG. 3a to FIG. 3c and FIG. 4a to FIG. 4c show the process of single-crystallizing amorphous silicon layer by the MILC utilizing the crystal filtering technique. FIG. 3a to FIG. 3c show the crystallization of amorphous silicon by the MILC propagating from the right side to left side in the drawing, in which Ni is used as the MIC source metal. Herein, FIG. 3a is a dark image of an optical microscope taken after thermal treatment of amorphous silicon for 30 hours at the temperature of 520° C.

As shown in the photograph, the crystallization by MILC is progressed in the right side of the filter channel 32 and poly-crystal silicon region 31 is formed therein. And the MILC is also progressed in the left side of the filter channel to create a single-crystal silicon region 33 rather than a poly-crystal silicon region. As shown in FIG. 2b and FIG. 2c, needle-shaped single crystal grains grow in the crystal growth front of the region poly-crystallized by MILC. If these needle-shaped single crystal grains continuously grow in irregular orientations, poly-crystal silicon is eventually formed in the MILC region. As shown in FIG. 3a, if the width of the filter channel 32 is adjusted so that only one crystal grain formed in the poly-crystal silicon region 31 may pass, the crystal grain passed the filter channel continue to grow so that it crystallizes the left side of the channel region into single-crystal silicon.

The single crystal passing the filter channel may grow up to hundreds of μm or more, and FIG. 4a to FIG. 4c show the crystallization state changed after performing additional thermal treatment for 15 hours to the structure of FIG. 3a to FIG. 3c. The region 34 where Ni was formed as the MIC source metal is shown in the right side of the drawings. The amorphous silicon in the MILC region 33 in FIG. 3 in the left side of the filter channel 32 is completely single-crystallized in FIGS. 4a to 4c, and the growth of the single crystal in the left side of the filer channel reaches hundreds of $\mu$m or more. As the typical size of the active layer of TFT is generally tens or hundreds of $\mu$m or less, the single crystal silicon region provided by this method can be sufficiently used to fabricate a semiconductor device. The device fabricated by this method has significantly improved characteristics as compared to the semiconductor device including conventional poly-crystal silicon layer.

FIG. 5a illustrates a conventional technique for forming the active layer of a thin film transistor with poly-crystal silicon layer by the MILC method and FIG. 5b illustrates a state that the channel region and its peripheral regions were crystallized by the crystallization method of FIG. 5a. As illustrated in FIG. 5a, an active layer 50 is formed of amorphous silicon on a substrate 100. A metal layer for inducing MIC of the amorphous silicon active layer is deposited on portions of the source region 51 and drain region 52 of the active layer. The MIC source metal is not deposited in the channel region beneath the gate electrode 53. The MIC source metal is not deposited on the portions of the source and drain regions which are adjacent to the gate electrode 53 to form metal-offset regions 54. When thermal treatment is performed on the active layer, the crystallization propagates from the source and the drain regions 51, 52 covered with the MIC source metal towards the channel region. Thus, the entire amorphous silicon layer in the channel region and the metal-offset region 54 is crystallized as shown in FIG. 5b. FIG. 5b is a schematic diagram illustrating the crystal structure formed in the metal offset region 54 and the channel region by the crystallization process illustrated in FIG. 5a. Referring to FIG. 5b, several silicon crystals are formed on both sides of the channel region, and a MILC boundary 55, at which the MILC poly-crystal silicon regions grown from both sides of the channel region meet with each other, is formed at the center portion of the channel region. The poly-crystal silicon produced by the MILC has inferior electrical characteristics such as electron mobility as compared to those of single crystalline silicon. Particularly, the silicide the MIC source metal such as Ni, which induced the MILC in the MILC regions, is accumulated at the MILC boundary 55, and it deteriorates the electrical characteristics such as leakage current and the electron mobility of the channel region.

The object of the present invention is to provide a method for fabricating a silicon active layer and a thin film transistor by utilizing the above-described crystal filtering technique to overcome the above-mention problems of the conventional poly-crystal TFT. In order to achieve these objects, the present invention provide a method for crystallizing a silicon active layer of a thin film transistor comprising the steps of: (a) forming an amorphous silicon layer on a substrate; (b) forming a crystallization source region including MIC source metal, an active layer region and a filtering channel connecting the crystallization source region and the active layer region by patterning the amorphous silicon layer; and (c) crystallizing the crystallization source region and the active layer region by performing thermal treatment of the patterned amorphous silicon layer.

According to another aspect of the present invention, the present invention provides a method for fabricating a thin film transistor including a crystallized silicon active layer comprising the steps of: (a) forming an amorphous silicon layer on a substrate; (b) forming a crystallization source region including MIC source metal, an active layer region and a filtering channel connecting the crystallization source region and the active layer region by patterning the amorphous silicon layer; (c) crystallizing the crystallization source region and the active layer region by performing thermal treatment of the patterned amorphous silicon layer; (d) forming a gate insulating layer and a gate electrode on the active layer region; (e) doping impurity into the active layer region; (f) forming a contact insulating layer at least on the active layer region and at least one contact hole in the contact insulating layer; and (g) forming at least one contact electrode being electrically connected to the active layer region through said contact hole.

Referring to accompanied drawings, preferred embodiments of the crystal filtering technique and the method for fabricating a TFT utilizing the crystal filtering technique are described in detail below.

BRIEF DESCRIPTION OF THE DRAWINGS

The embodiments of the present invention will be explained with reference to the accompanying drawings, in which:

FIG. 7a to FIG. 7l are drawings illustrating various configurations and structures of the crystal filter according to the present invention.

DETAILED DESCRIPTION OF THE INVENTION

Figure 5A:
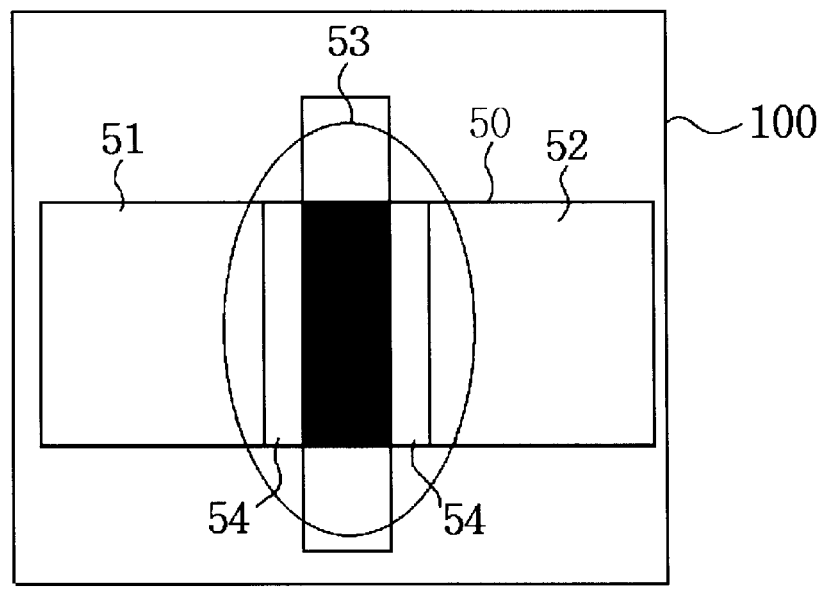
FIG. 5a and FIG. 5b are diagrams illustrating the crystallization states of the channel region and its periphery crystallized by conventional method.
Figure 5B:
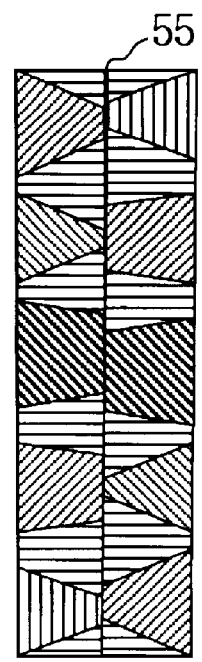
Figure 6A:
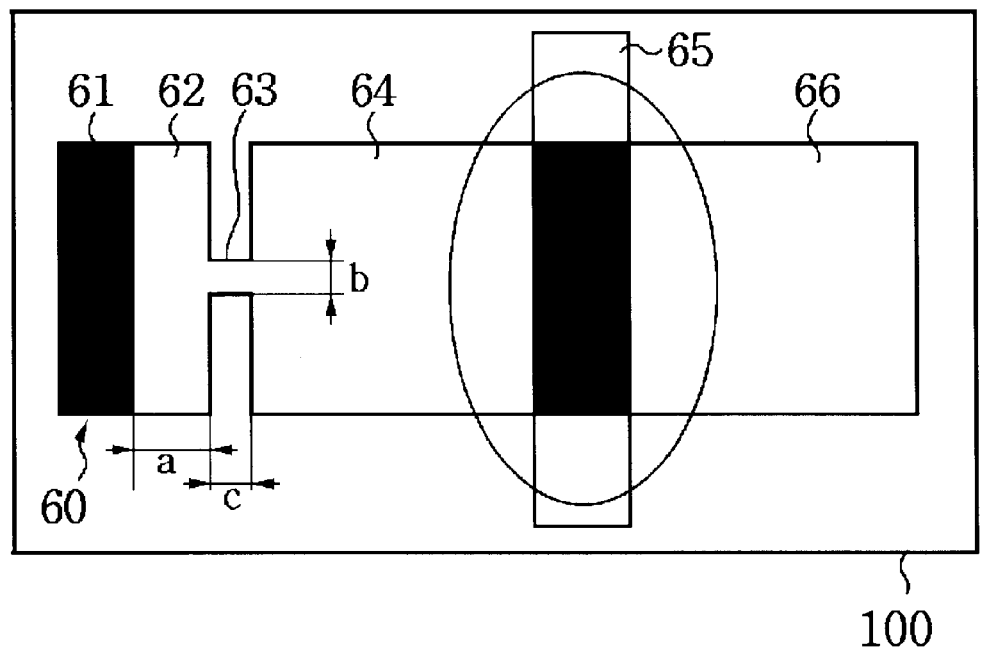
FIG. 6a and FIG. 6b are drawings illustrating the crystallization states of the channel region and its periphery crystallized by the method of the present invention.

FIG. 6a is a schematic diagram showing the structure of the present invention utilizing the crystal filtering technique to resolve the problems of the conventional art shown in FIG. 5. As shown in FIG. 6a, an amorphous silicon layer is formed on a substrate 100 and patterned to form a crystallization source region 60, an active layer region 67 and a crystal filtering channel 63 connecting the crystallization source region 60 and the active layer region 67. The active layer region comprises a source region 64, a channel region beneath the gate electrode 65 and a drain region 66. The crystallization source region 60, the active layer region 67 and the crystal filtering channel 63 may be simultaneously formed by patterning the amorphous silicon layer. The crystallization source region 60 and the crystal filtering channel 63 constitutes a crystal filter and the crystallization source region includes a MIC source region 61 where MIC source metal is formed and the region 62 where MIC source metal is not formed. The MIC source metal is formed with a thickness of 1 to 200 Å using sputtering, evaporation, and CVD and the like. The width "a" of the region 62 where the MIC source metal is not deposited may be properly adjusted so that one or a part the crystal grain of the poly-crystal silicon formed by the MILC propagating from the MIC source region 61 may pass the crystal filtering channel 63. Generally width "a" is in the range of 2~50 μm and more desirably in the range of 5~20 μm.

When conducting thermal treatment of the substrate on which the active layer and the crystallization source region are formed, the crystallization by MILC propagates from the MIC source region 61 and the front of the MILC reaches the filtering channel 63 across the region 62. The width "b" of the filtering channel 63 can be adjusted in connection with the width "a" so that one or a part of the crystal grain may pass. Generally, the width "b" is in the range of 0.1–20 μm and more desirably in the range of 1~5 μm. It is desirable that the width "b" of the filtering channel 63 is broadened in proportion to the width "a" of the region 62. It is because that the width of the region 62 becomes larger, the size of the crystal grain which reaches the filtering channel 63 becomes larger accordingly. Generally, the length c of the filtering channel is in the range of 0.1–20 μm. Despite the illustration of FIG. 6a, the configuration and position of the filtering channel may be changed as will be described below.

Figure 4A:
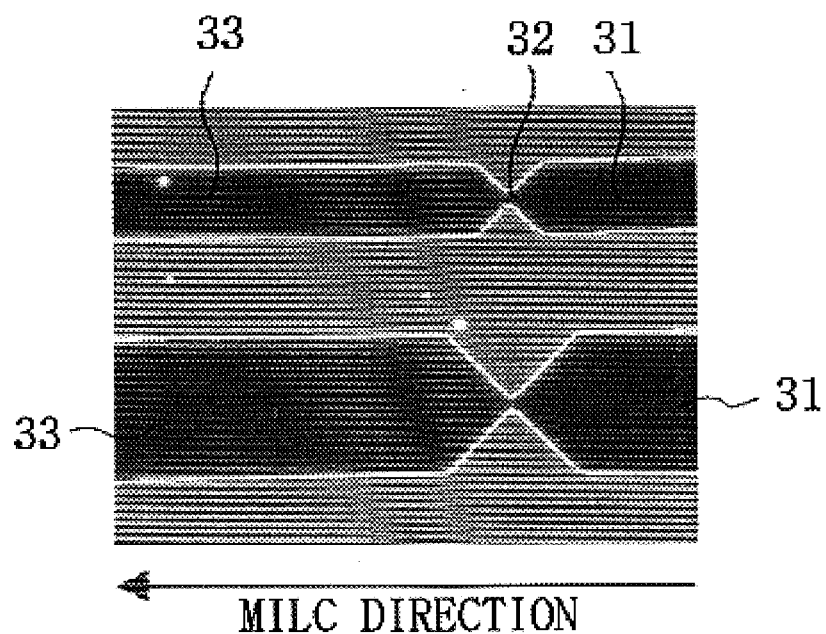
FIG. 4a to FIG. 4c are a dark image of optical microscope and a diagram illustrating the MILC propagating after passing a crystal filter.
Figure 4B:
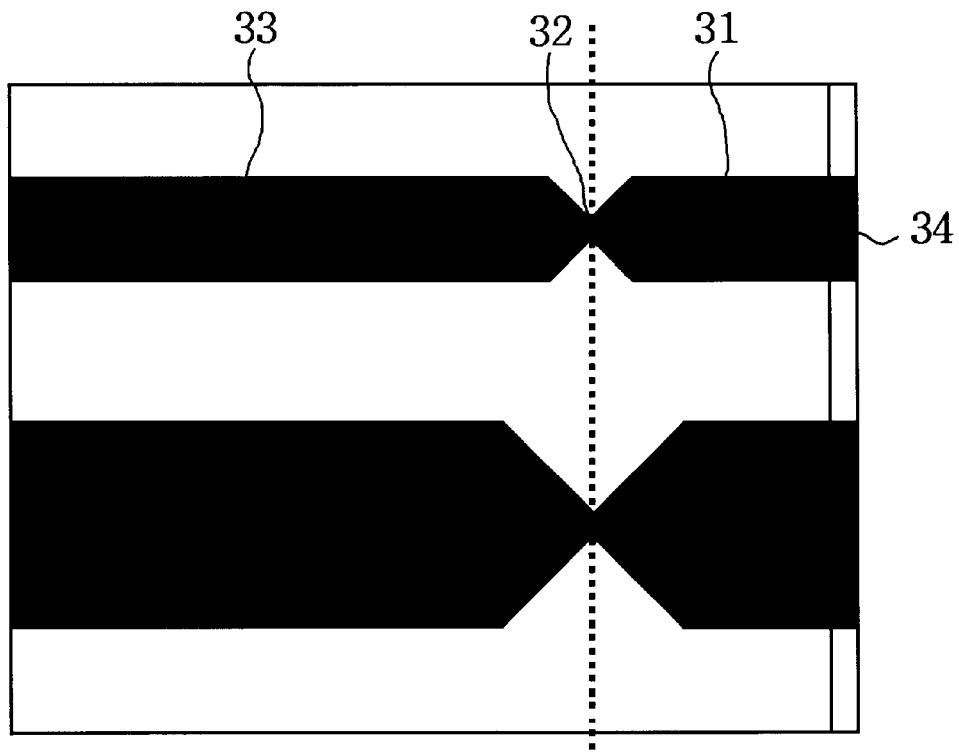
Figure 4C:
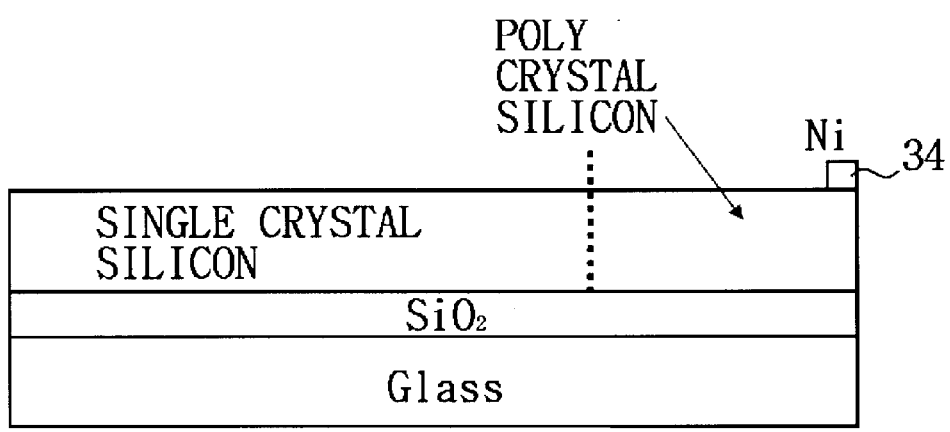

The filtering channel 63 functions to selectively pass (i.e., filter) the crystal grain that is growing in the parallel direction with respect to the channel direction among the crystal grains of the poly-crystal silicon arriving at the filtering channel from the MIC source region 61. In this meaning, the channel 63 is referred to as "crystal filtering channel." The crystal grain passing the crystal filtering channel 63 has a substantially uniform crystal direction. Thus, as the thermal treatment is progressed, the crystallization as described referring to FIG. 4 is progressed in the region beyond the filtering channel, which is the active layer region 67. The crystal or crystals passing the crystal filter continue to grow in the active layer region 67, and thus the active layer is crystallized as a single crystal layer or a poly-crystal layer comprising a certain number of crystals. If an optimal structure of the crystal filter and the process conditions are adopted, the active layer region may be crystallized into a single crystal layer.

Figure 6B:
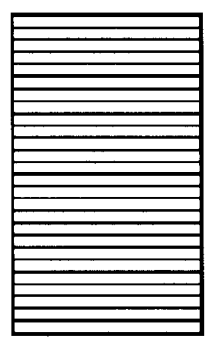

FIG. 6b is a schematic diagram illustrating the crystallization state of the channel region beneath the gate electrode 11 obtained by the method explained referring to FIG. 6a. FIG. 6b shows that the channel region of the active layer is crystallized with substantially uniform crystal orientation. If the active layer is crystallized according to this method, the channel region which most significantly affects the characteristics of a thin film transistor may be formed with a single crystalline silicon layer as shown in FIG. 6b. By utilizing the method of the present invention, the entire active layer of the thin film transistor can be single-crystallized. However, in order to reduce the crystallization time, the thin film transistor can be fabricated after some portion of the active layer, particularly the channel region is single-crystallized.

It should be understood that the crystallization source region used to crystallize the active layer region and the crystal filter comprising the crystal filtering channel may be constituted in various configurations as long as the following conditions are met:

(1) The active layer region and the crystallization source region are mutually connected by a crystal filtering channel having narrower width than that of the active layer region;
(2) The MIC source metal is deposited or implanted in some portion of the crystallization source region;
(3) The MIC source metal and the crystallizing filtering channel should be separated by a certain distance.

If these conditions are met, the configuration and structure of the crystal filter may be changed in various ways. The examples of the crystal filter used in the present invention are described in the following.

Figure 7B:
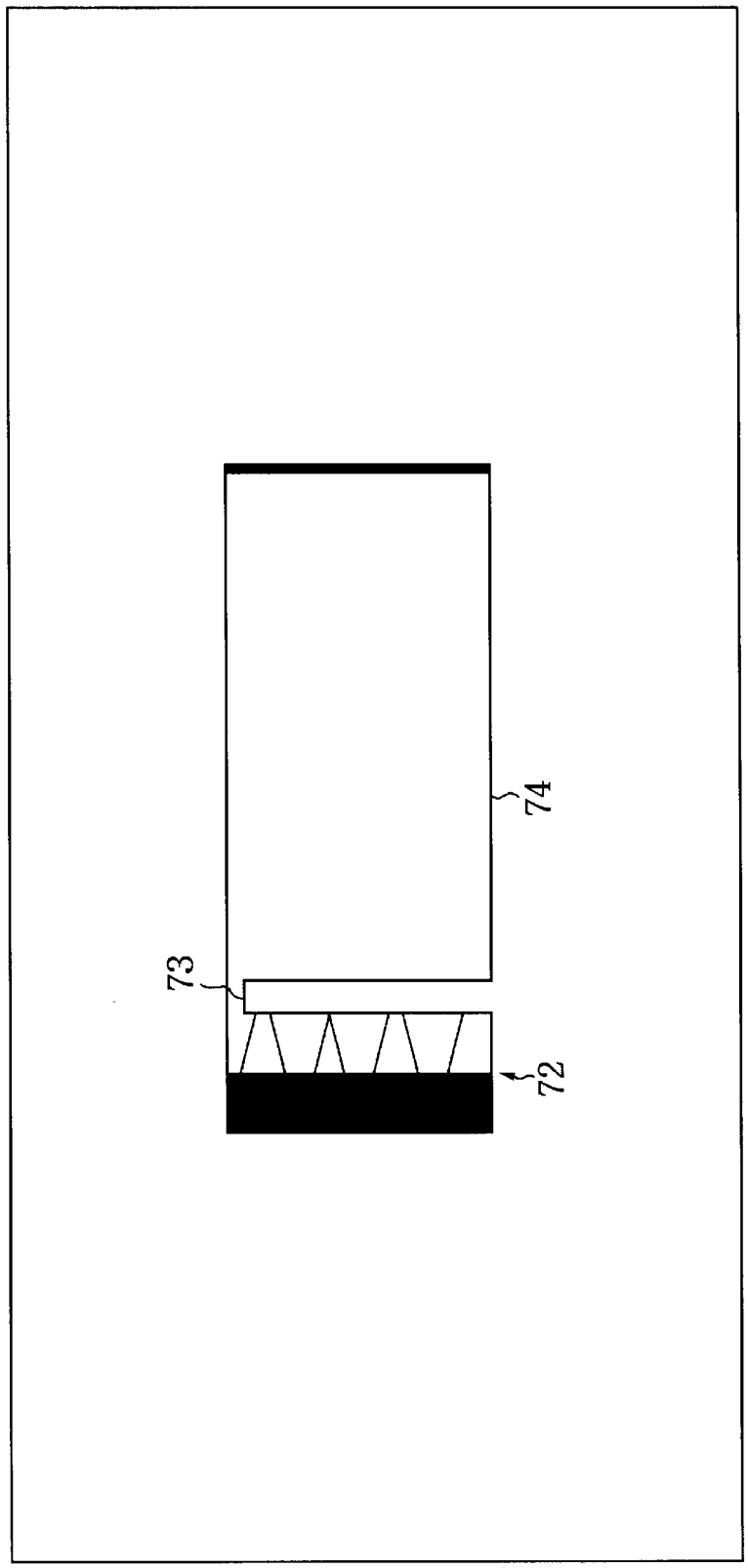
Figure 7C:
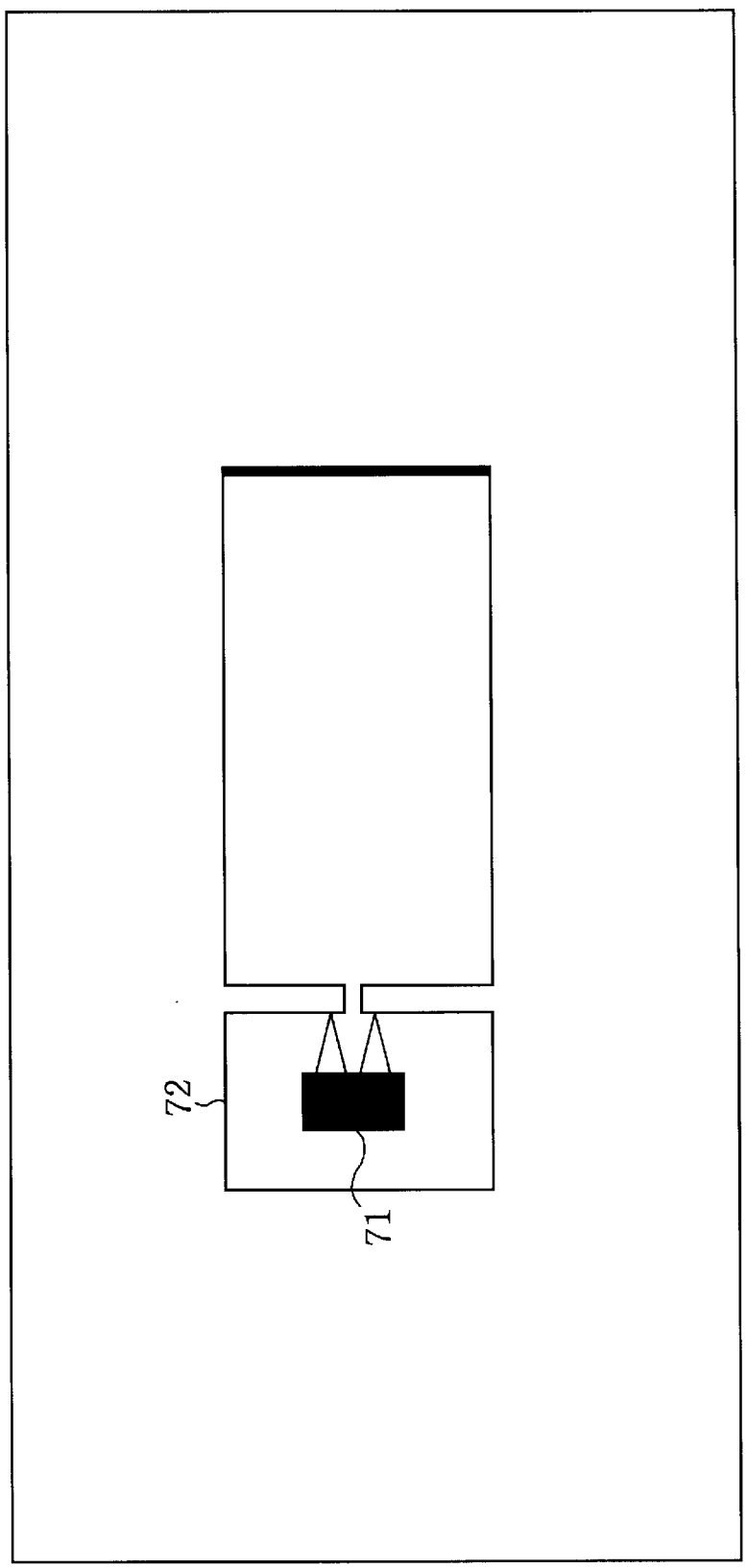
Figure 7D:
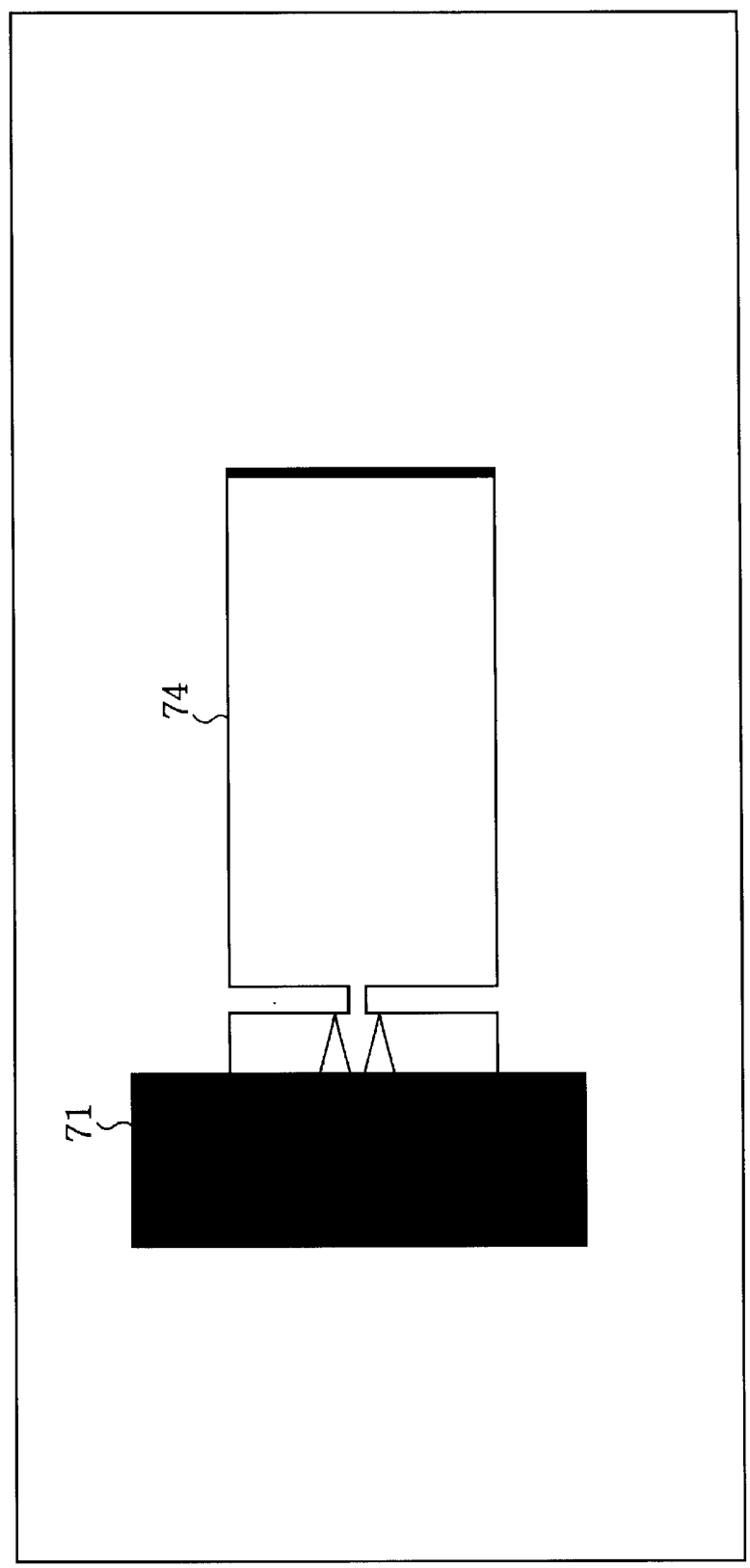
Figure 7E:
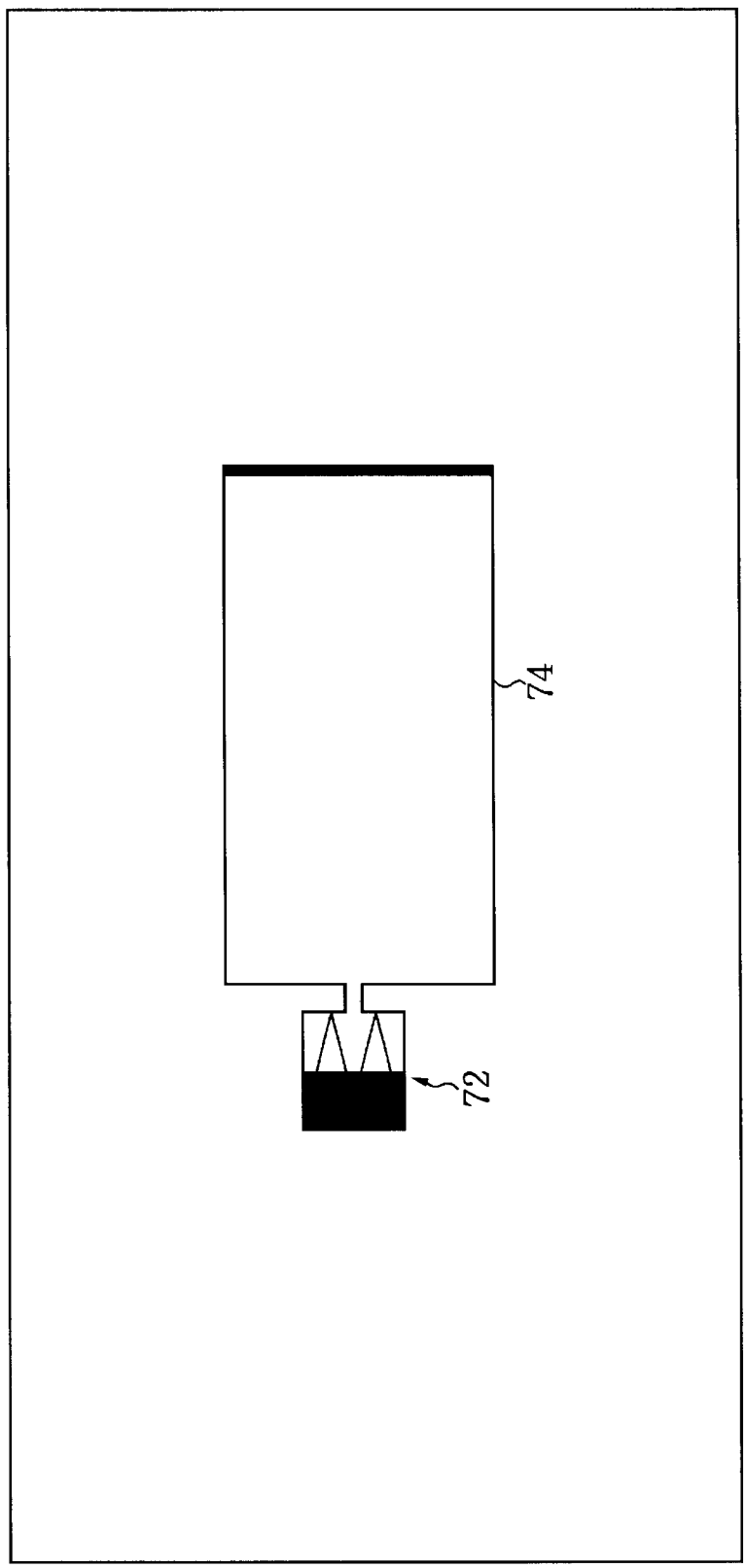
Figure 7F:
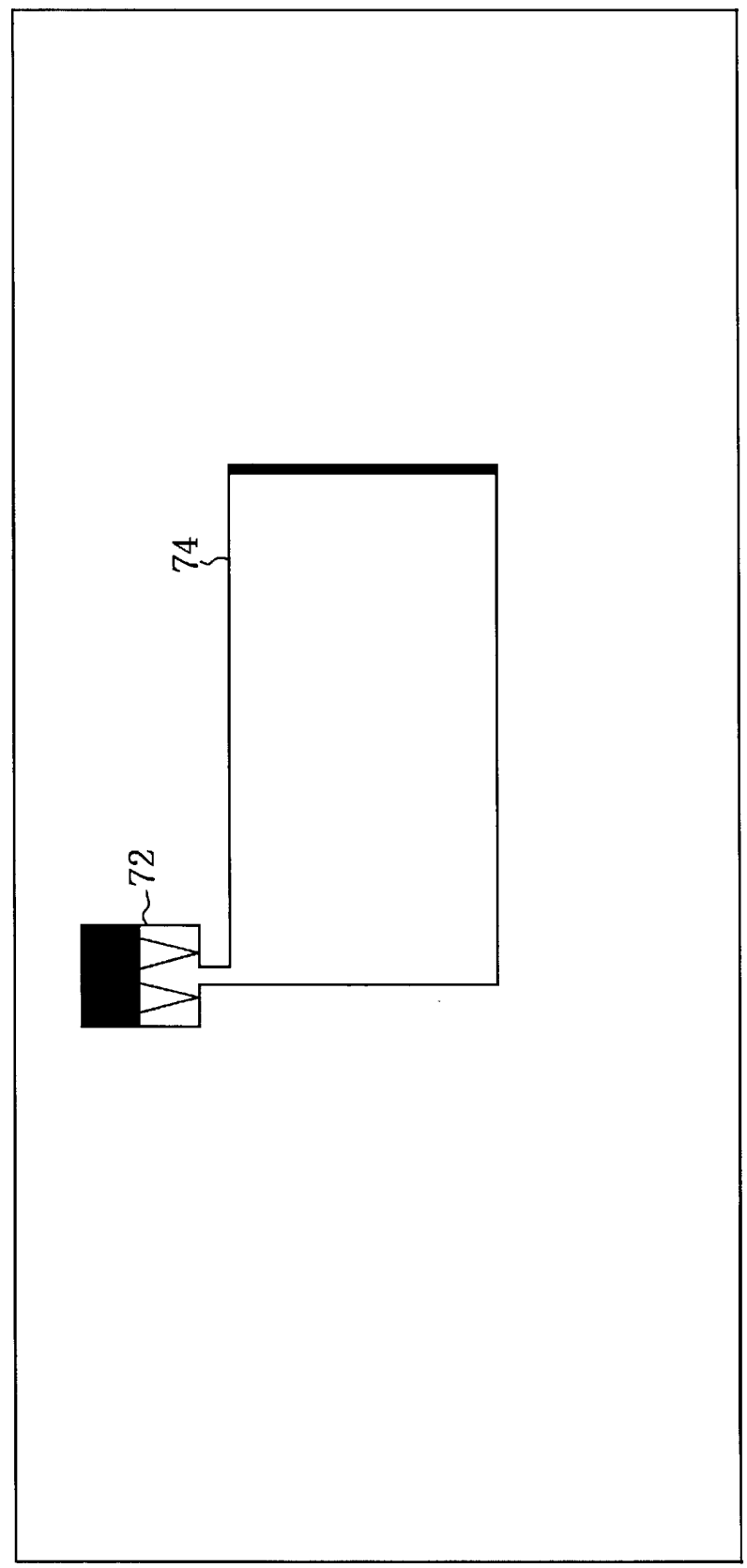
Figure 7G:
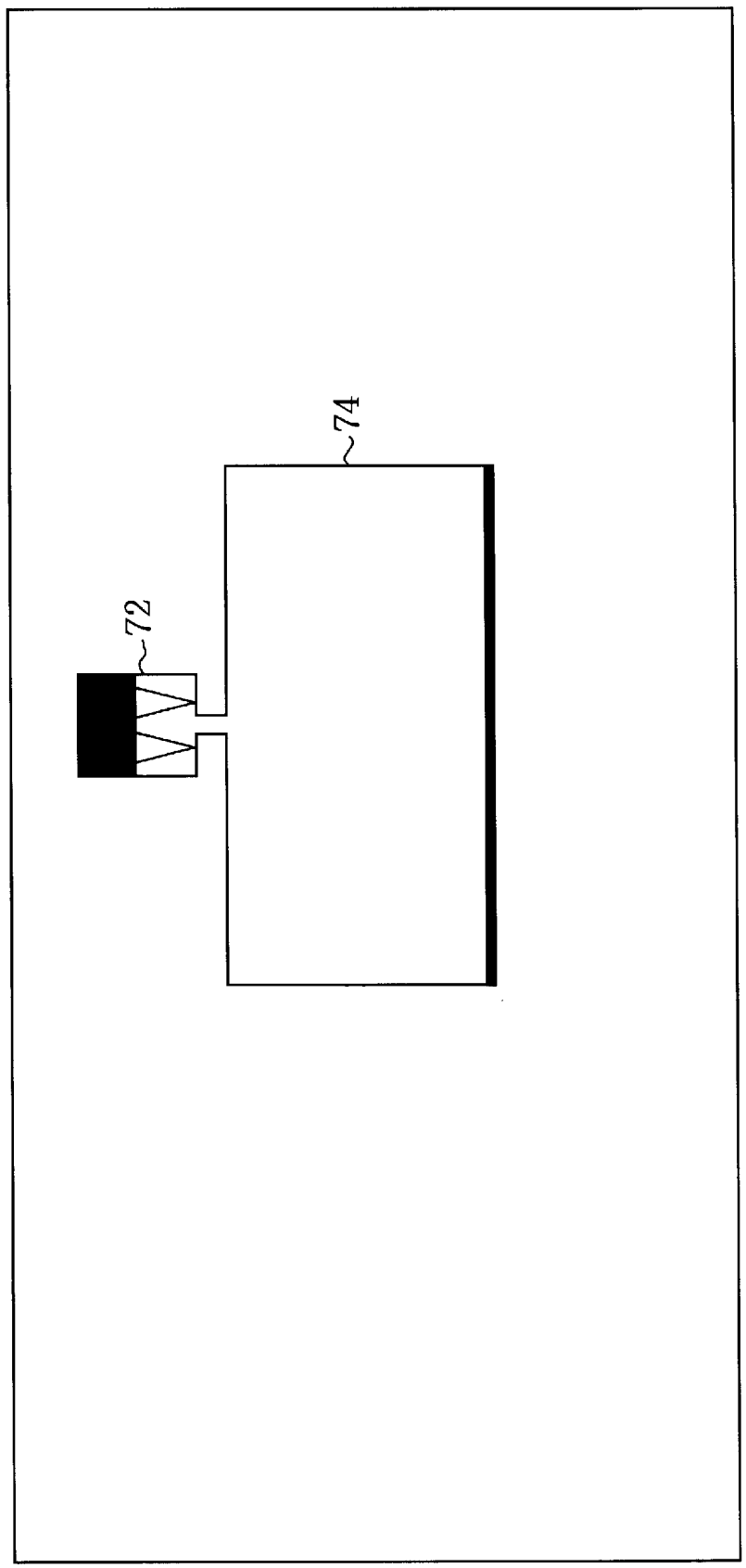
Figure 7H:
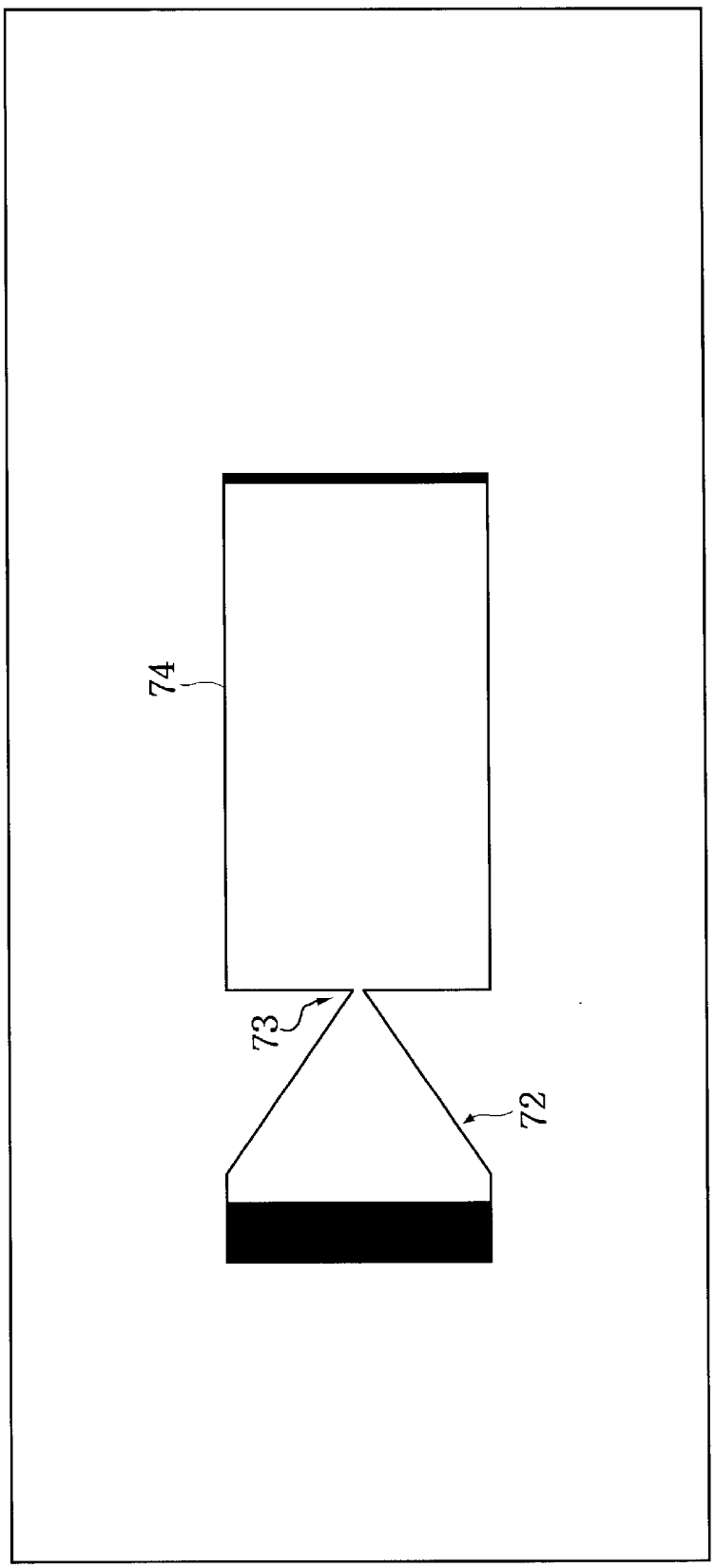
Figure 7I:
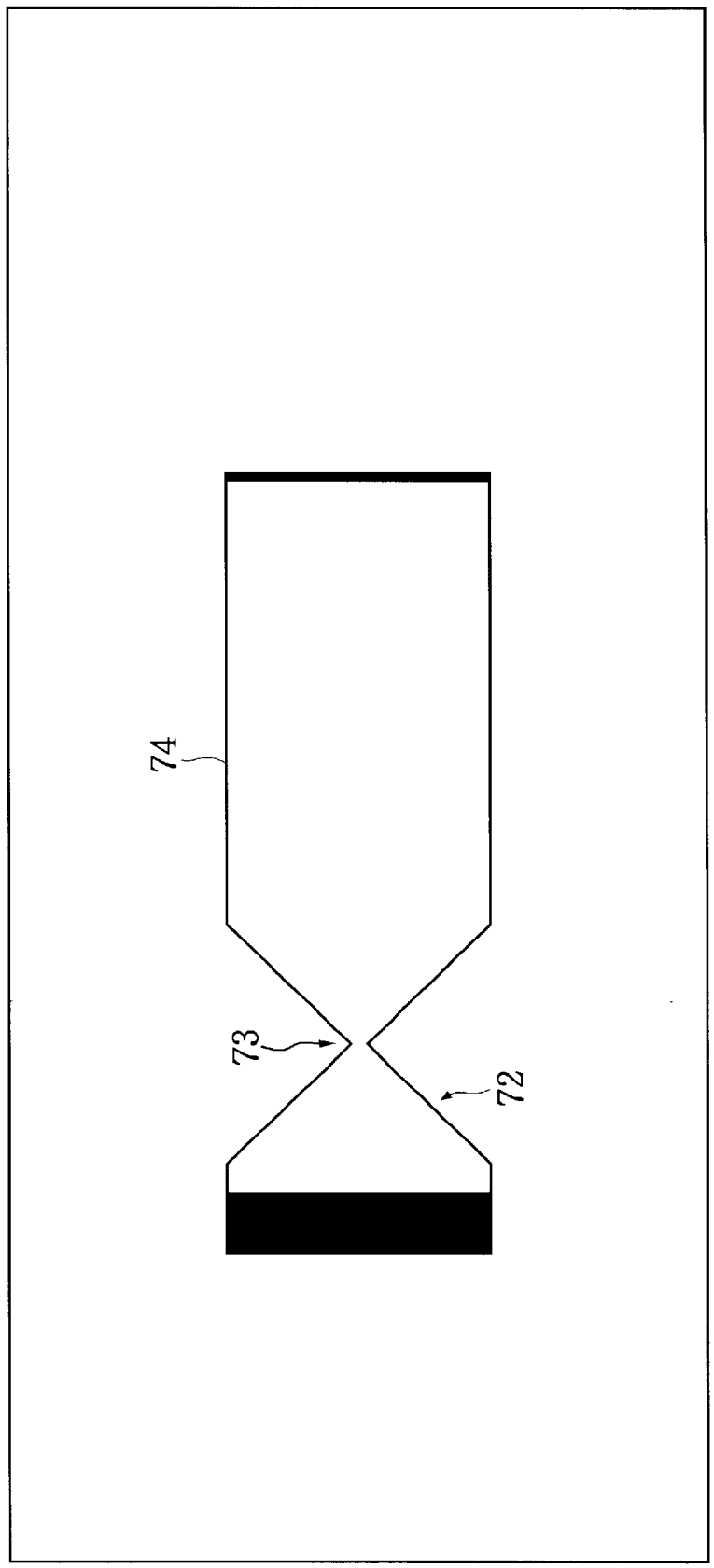
Figure 7J:
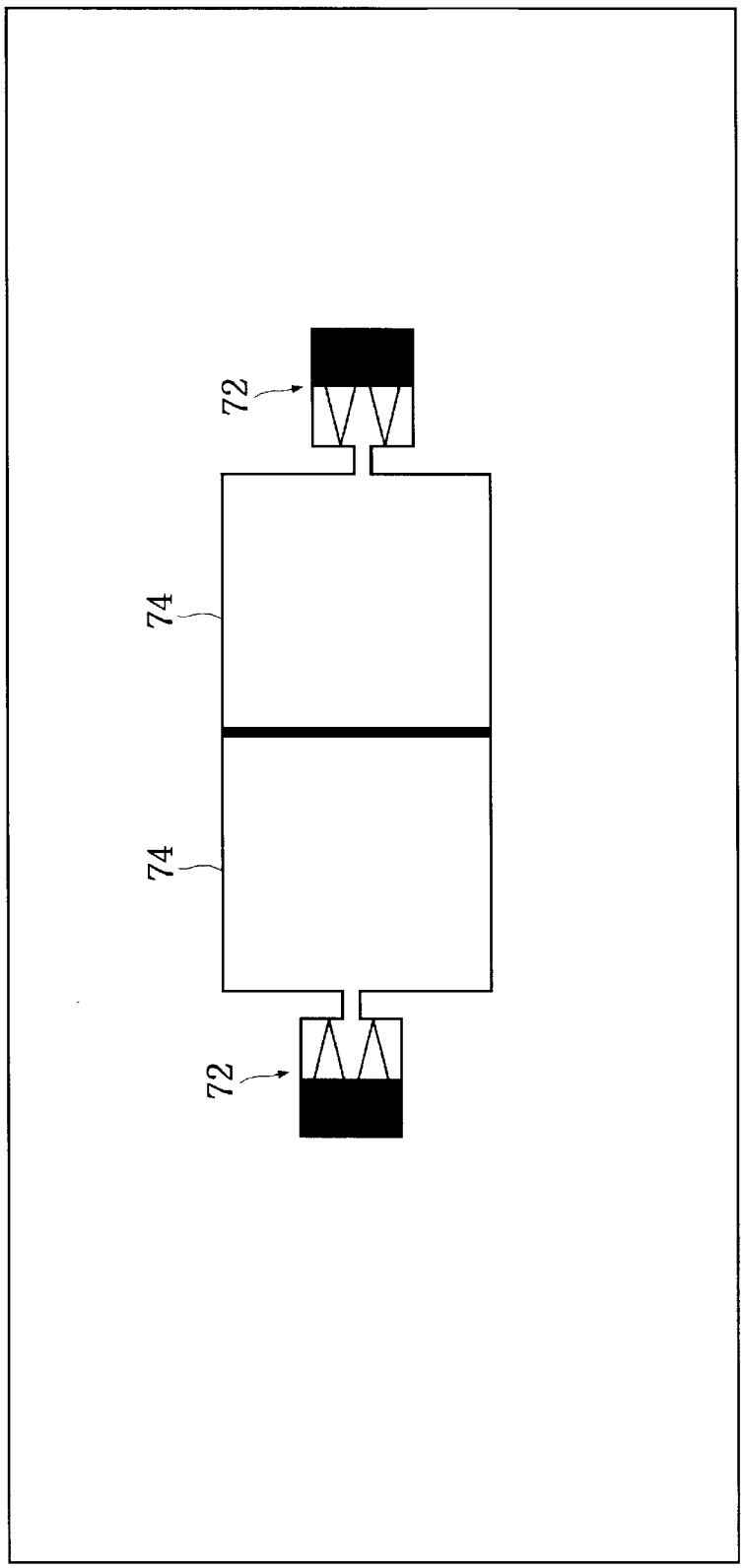

FIG. 7a is a plane view showing a typical structure of the crystal filter used in the present invention. The crystallization source region 72 and the active layer region 74 are formed in square shapes with the same width, and the MIC metal region 71 is formed along one side of the crystallization source region and separated from the crystal filtering channel 73 by a predetermined distance. The crystal filtering channel 73 is located at the center of the width of the active layer region. The crystal filter structure illustrated in FIG. 7b is identical to the structure of FIG. 7a except that the location of the crystal filtering channel 73 is shifted to one side of the active layer 74. As shown in FIG. 7c, the MIC metal region 71 of the crystallization source region 72 can be formed at the center portion of the crystallization source region 72. As illustrated in FIG. 7d, the MIC metal region 71 of the crystallization source region can be made to be broader than the width of the active layer region 74. As FIG. 7e, the crystallization source region 72 may have a narrower width than the active layer region 74. As shown in FIG. 7f and FIG. 7g, the crystallization source region 72 may be positioned at an edge or a lateral side of the active layer region 74. Or, as shown in FIG. 7h, the crystallization source region 72 may have a tapered shape in which the width is gradually reducing in the direction toward the crystal filtering channel 73. As shown in FIG. 7i, both of the crystallization source region 72 and the active layer region 74 may have tapered shapes in the parts connected to the crystal filtering channel 73. And, like FIG. 7j, the crystallization source region 72 can be positioned on both sides of the active layer region 74. Using the crystal filter illustrated in FIG. 7j, two crystal regions are formed in the active layer region 74. However, the characteristics of the single crystal device may be obtained if the channel region, which most significantly affects the operation characteristics of the thin film transistor, is positioned within one crystal region by adjusting the position of the thin film transistor in the crystallized active layer region 74. Using the crystal filer structure illustrated in FIG. 7j, the crystal growth is progressed in both sides of the active layer region so that the time for crystallizing the active layer region may be significantly reduced.

Figure 7K:
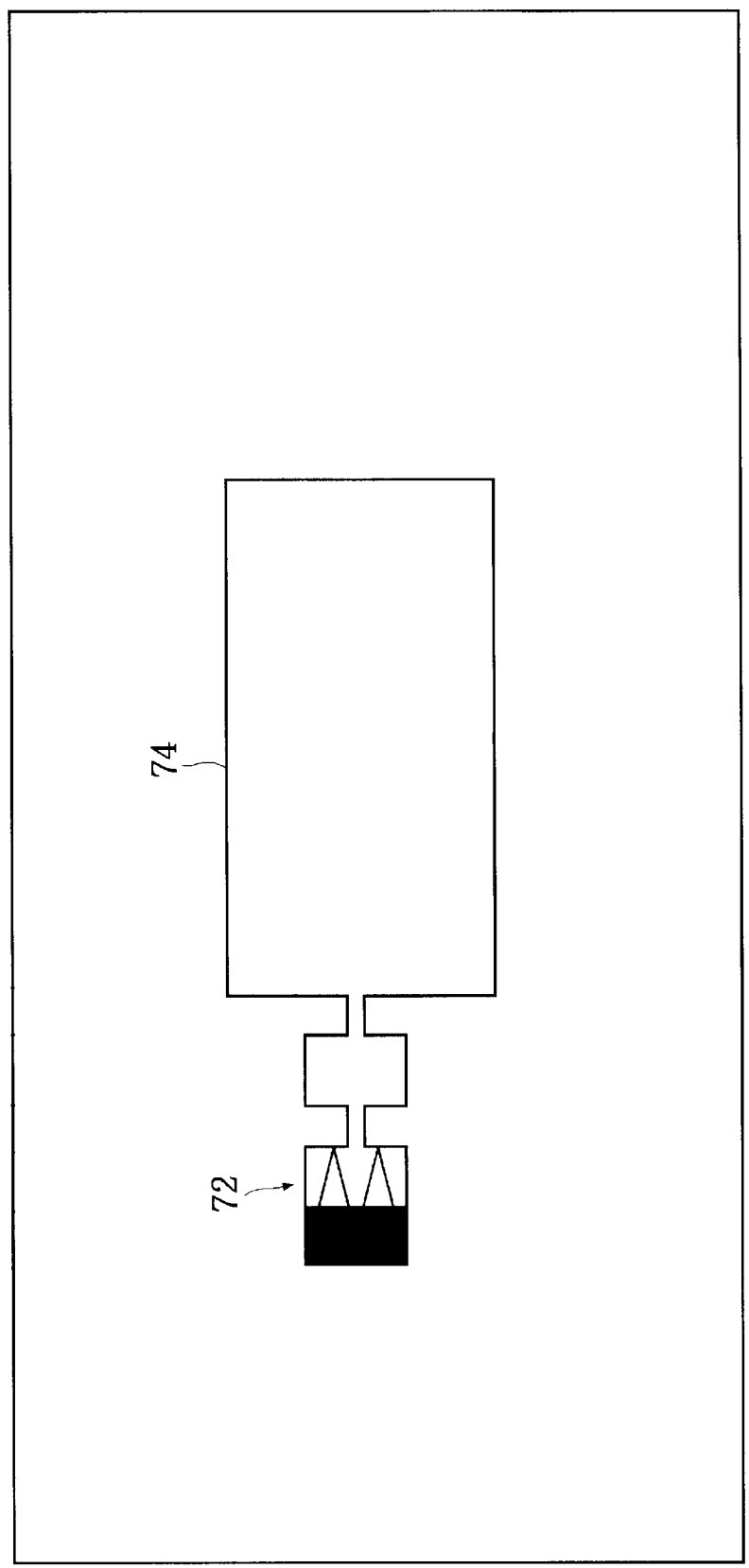
Figure 7L:
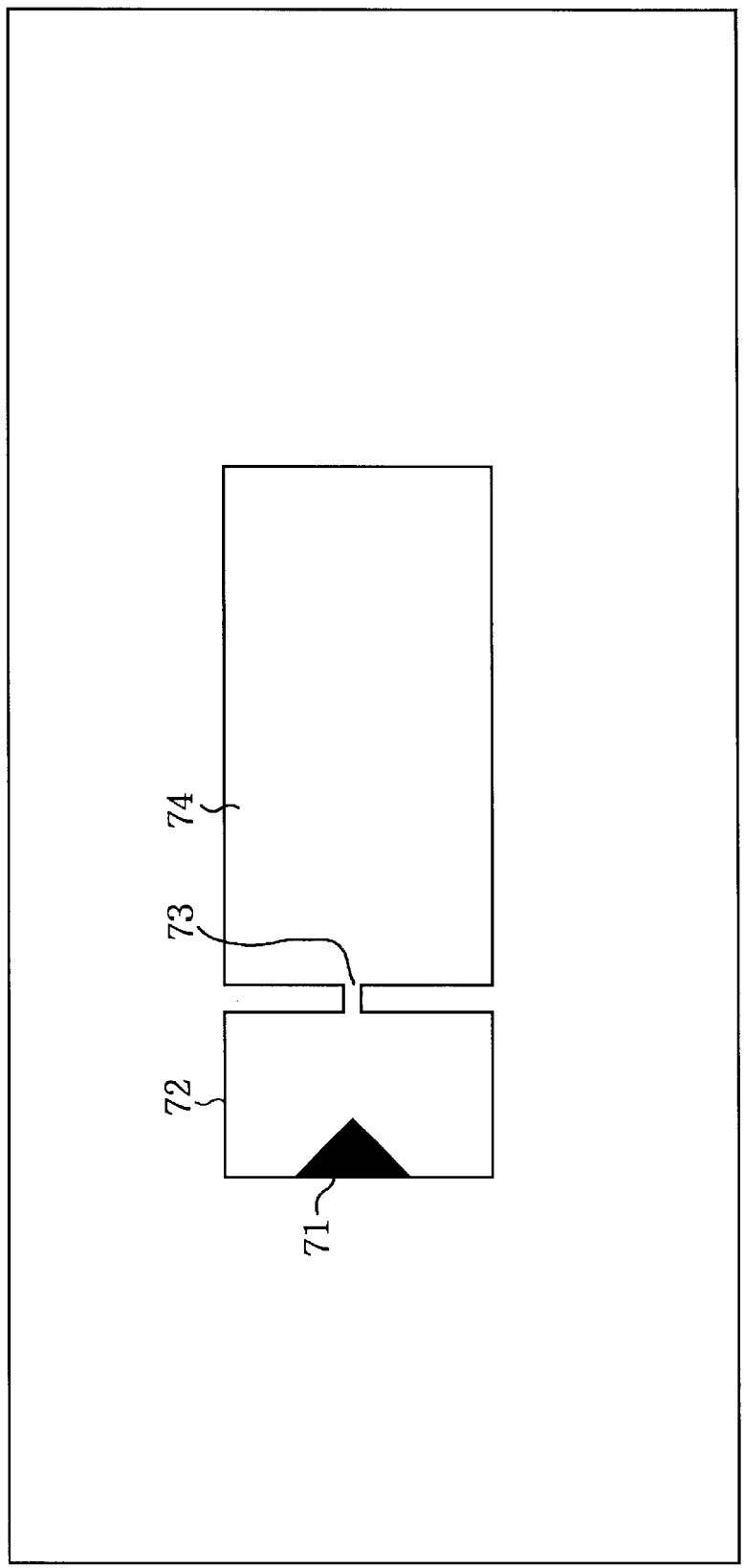

The crystal filtering effect can be further enhanced by making the crystallization source region 72 in two stage structure as shown in FIG. 7k. According to needs, the crystallization source region can be formed in multiple stages over two. Also, as shown in FIG. 7l, the MIC metal layer 71 can be formed in a wedge shape rather than a rectangular shape. In case that the end of the MIC metal layer facing the filtering channel 73 is sharpened, the effect of the crystal filter can be further improved. During MILC, crystal grains most likely grow in the vertical direction from the surface of the MIC source metal. Thus, if the MIC metal region has a wedge shape as illustrated in FIG. 7l, the silicon crystal grows in the radial direction from the MIC source metal layer 71 during the crystallization process. In that case, due to the radial growth of the crystal grains, the probability that only one crystal grain enters the filtering channel 73 is increased and the filtering efficiency is enhanced accordingly. Besides the wedge shape, the MIC metal layer 71 may be formed in the shape of a dot or a line extending toward the crystal filtering channel. To induce the radial growth of the crystal grains, it is desirable that the tip of the MIC metal layer facing the filtering channel have a width of 1 μm or less.

The low temperature single crystallization method used in the present invention can be performed as described in Korean Patent No. 276378. Although various metallic materials such as Ni, Pd, Ti, Ag, Au, Al, Sn, Sb, Cu, Co, Cr, Mo, Ti, Tr, Ru, Rh, Cd and Pt can be used as the crystallization source metal, Ni and Pd are most effective as the material inducing crystallization of amorphous silicon according to the present invention.

Below, several embodiments of the inventive method for fabricating a thin film transistor utilizing the above crystal filtering technique are explained referring to accompanied drawings.

Embodiment 1

FIG. 8a to FIG. 8g are diagrams illustrating the process for fabricating a TFT after crystallizing an amorphous silicon layer according to the method of the present invention.

Figure 8A:
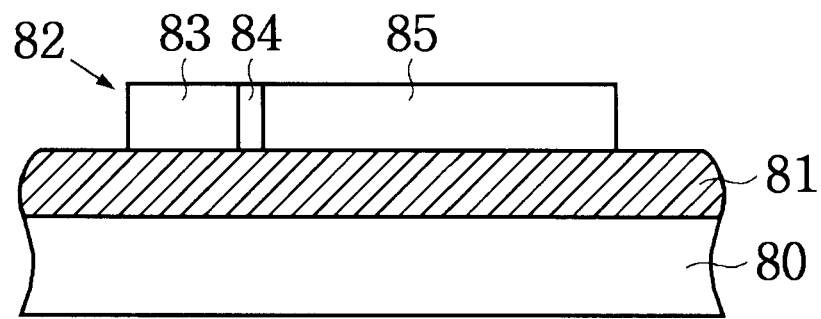
FIG. 8a to FIG. 8g are diagrams illustrating the process of fabricating a thin film transistor according to a first embodiment of the present invention.
Figure 8A:
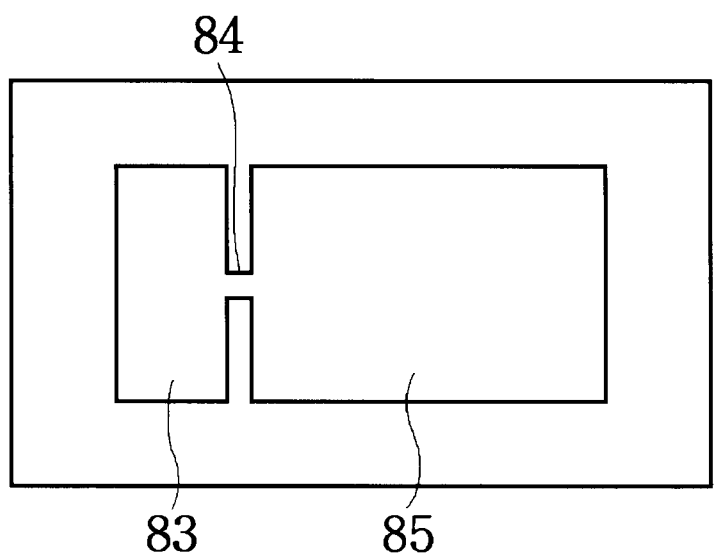

FIG. 8a and FIG. 8a' are respectively a cross-sectional view and a plain view of the state in which a bottom insulating layer 81 and an amorphous silicon layer 82 of appropriate thickness are formed on a glass substrate 80 and patterned to have desired shapes. The bottom insulating layer 81 is formed to protect the silicon layer forming the active layer of a TFT from diffusion of contaminants. However, according to the circumstances, the amorphous silicon thin layer may be directly formed on the substrate without the bottom insulating layer 81. The amorphous silicon layer is formed by utilizing conventional methods such as low pressure chemical vapor deposition, high pressure chemical vapor deposition and Plasma Enhanced (PE) CVD and the like. The amorphous silicon layer 82 formed on the substrate is patterned by an etching process using mask like photoresist to form a crystallization source region 83, a crystal filtering channel 84 and an active layer region 85 as illustrated particularly in FIG. 8a'.

Figure 8B:
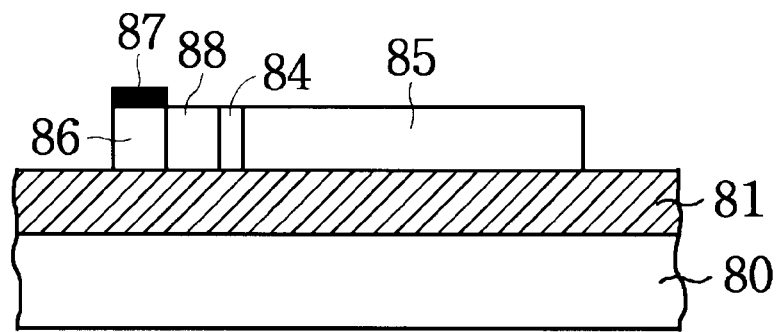
Figure 8B:
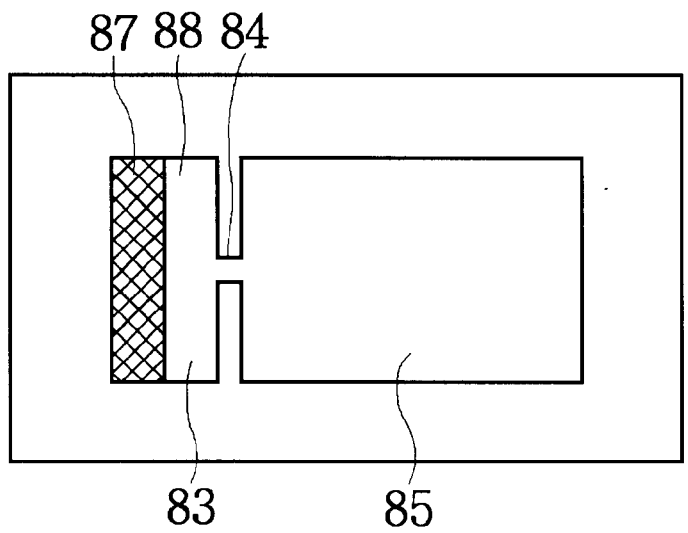

Then, as illustrated in FIG. 8b and FIG. 8b', a MIC source metal 87 such as Ni is deposited in a portion of the crystallization source region, where a MIC region 86 will be formed. The MIC source metal may be formed by depositing a metal layer on the entire surface of the substrate and patterning the metal layer into a desired shape. Alternatively, the MIC source metal may be formed by masking the substrate with photoresist to expose only the MIC region 86 and depositing MIC source metal like Ni utilizing conventional deposition methods such as low pressure chemical vapor deposition, high pressure chemical vapor deposition, plasma enhanced (PE) CVD, sputtering, evaporation and the like. After deposition of the MIC source metal 87, the photoresist is removed to leave the MIC source metal only on the MIC region 86. As described above, the MIC source metal 87 is formed to be separated from the crystal filtering channel 84 by a predetermined distance.

Figure 1A:
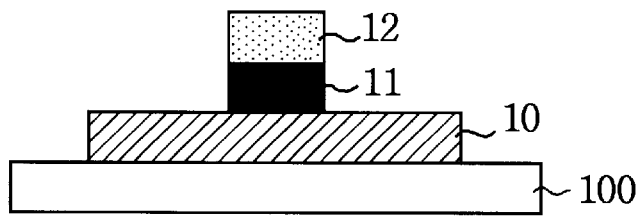
FIG. 1a to FIG. 1d are cross-sectional views illustrating the process of prior art for crystallizing the active layer of a thin film transistor by MILC.
Figure 1B:
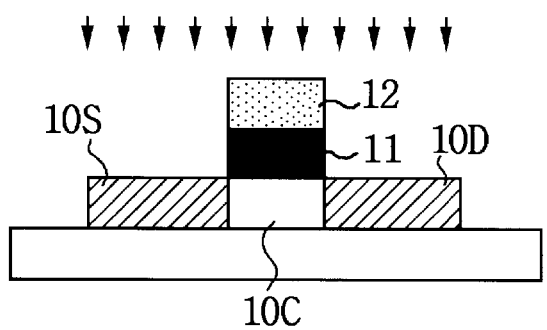
Figure 1C:
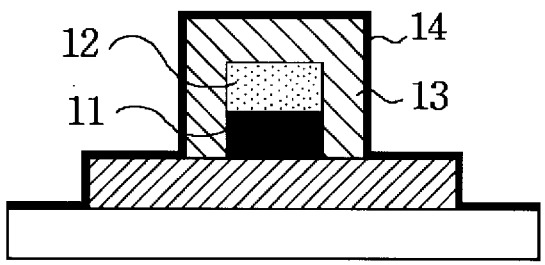
Figure 1D:
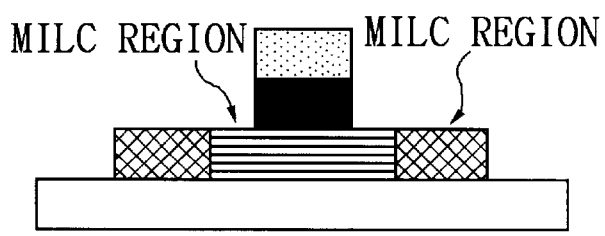
Figure 2A:
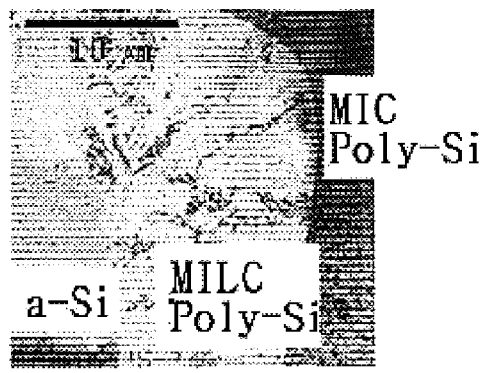
FIG. 2a to FIG. 2c are electron microscope photographs and schematic diagram showing the crystallization process in the MILC region.
Figure 2B:
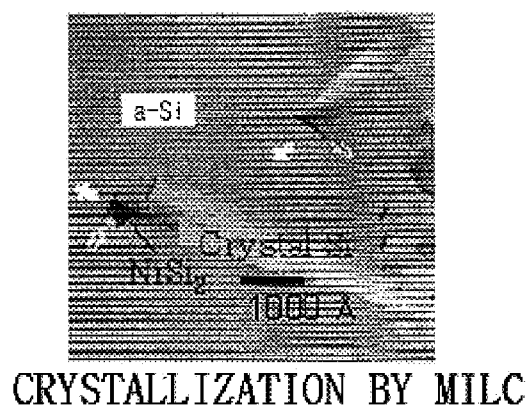
Figure 2C:
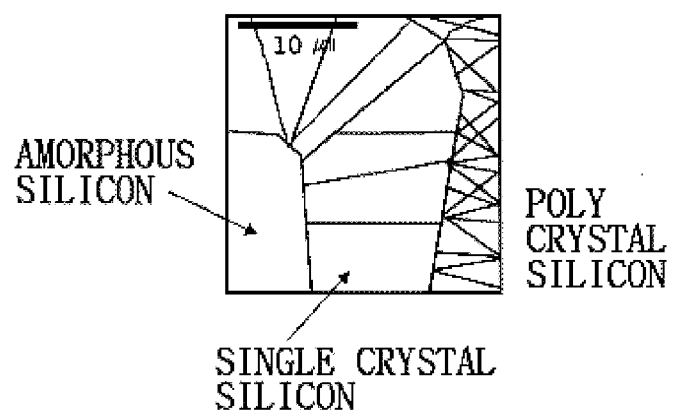
Figure 3A:
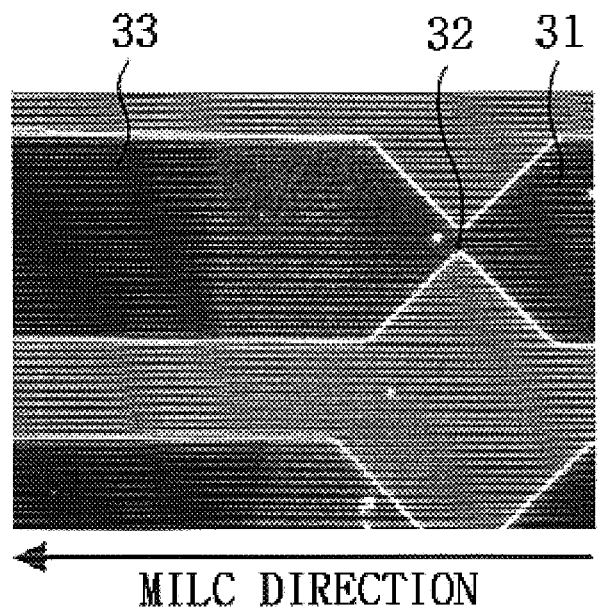
FIG. 3a to FIG. 3c are a dark image of optical microscope and a diagram illustrating the MILC propagating after passing a crystal filter.
Figure 3B:
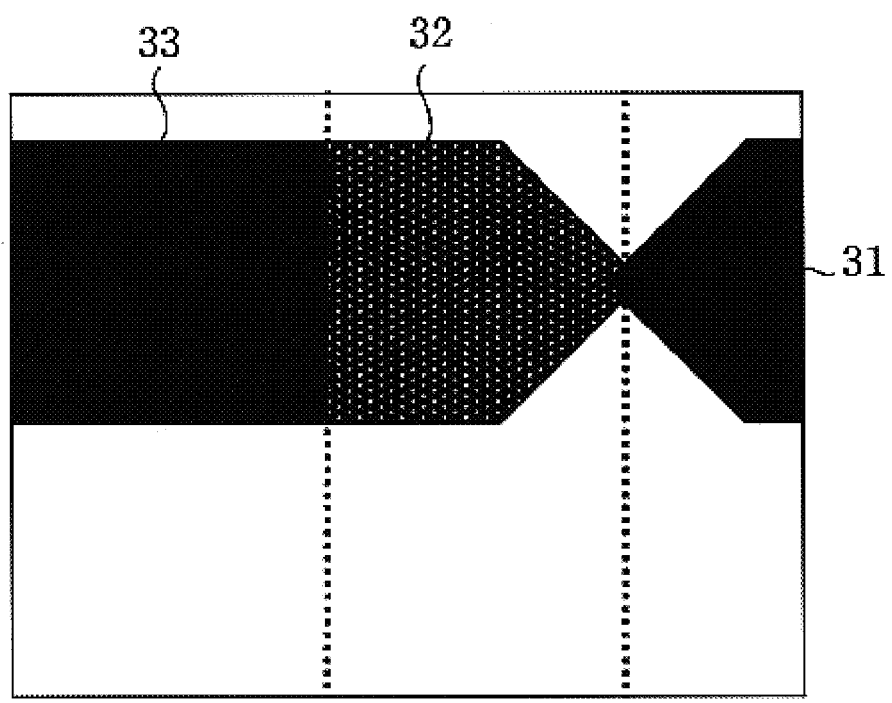
Figure 3C:
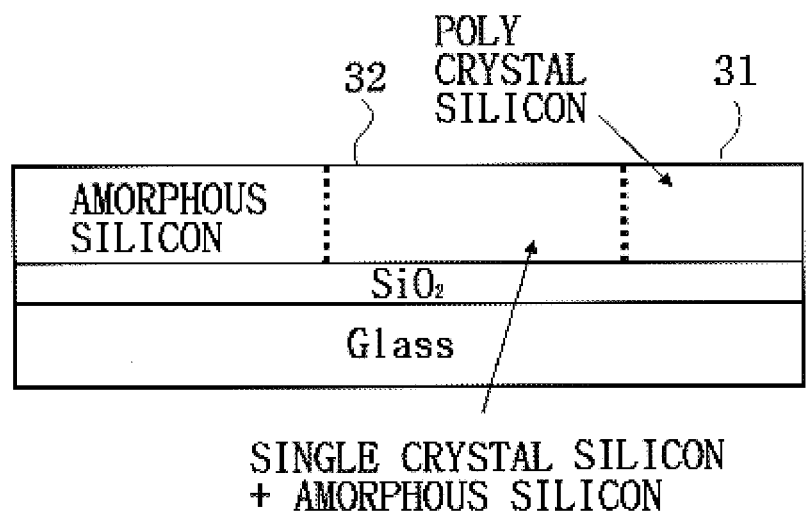
Figure 8C:
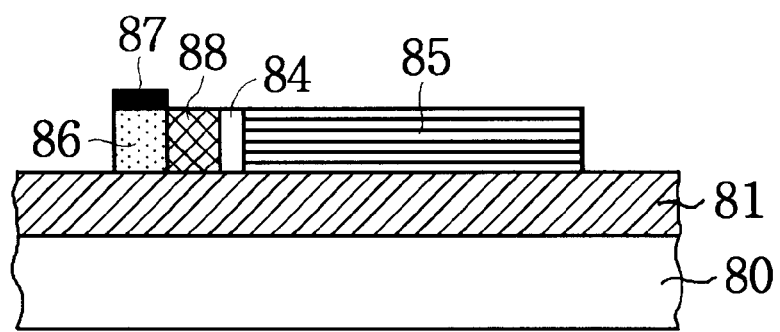
Figure 8C:
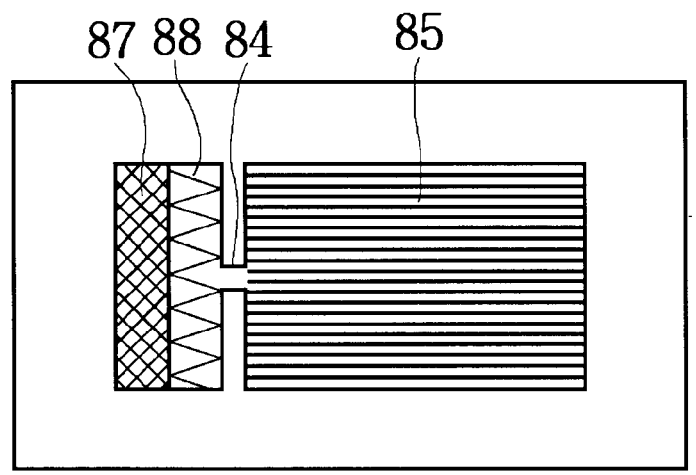

After the MIC source metal layer is deposited, the amorphous silicon layer is crystallized by conducting a thermal treatment of the entire substrate in a furnace as shown in FIG. 8c and FIG. 8c'. Generally the thermal treatment for crystallizing the amorphous silicon layer is performed at the temperature of 400~600° C., and more desirably at 500~600° C. in a furnace. As the thermal treatment is progressed, the amorphous silicon layer under the MIC source metal is poly-crystallized by MIC to form the MIC region 86. And, the region 88 adjacent to the MIC region and uncovered by the MIC source metal is poly-crystallized by MILC propagating from the MIC region 86. When the crystal growth front of the MILC in the region 88 reaches the crystal filtering channel 84, only the crystal component having a certain orientation passes the filtering channel 84. Then, the crystal component which passed the crystal filtering channel begins to crystallize the region 85 which will be used as active layer of the TFT. During the thermal treatment, the active layer region is crystallized from the portion adjacent to the crystal filtering channel 84. Although the filtered crystal component induces single crystallization of the active layer region, single crystal and amorphous (or poly-crystal) silicon regions coexist (as shown in FIG. 3) in the active layer region, particularly at the initial stage of the crystallization. However, as the crystallization process is progressed, single crystal component gradually becomes dominant in the active layer region. When crystallizing the active layer region according to this method, the crystallization process may be terminated when the single crystalline component of the active layer becomes higher than a predetermined level to reduce the time required for the crystallization. If the crystal filtering technique by the present invention is used, even when the active layer is not completely single crystallized, the single crystalline component of the active layer is greatly increased as compared to the poly-crystallization method using conventional MILC. Therefore, the characteristics of the active layer can be significantly greatly improved.

Although the above embodiment is described to conduct thermal treatment in a furnace, the present invention may also use other thermal treatment methods. For example, light thermal treatment using a high temperature lamp and the like is also applicable. Light thermal treatment illuminates light of high temperature lamp on the whole surface of the substrate to perform the thermal treatment of the whole substrate at a time. Although this method is fast and simple, it may cause the growth of crystal grains outside of the MILC region by the illumination of the light. The generation of crystal grains outside of the MILC region adversely affects the single crystallization of the active layer.

As an alternative method to overcome this problem, light scanning method can be used. This method illuminates light on a portion of the substrate and scans the light beam through the surface of the active layer region. When using the light scanning method, the MIC source metal should be positioned at the position where the light scanning starts. In other words, light scanning direction should be designed to be equal to the crystal growth direction. According to the circumstances, the light can be scanned in an overlapping manner or in multiple stages. As the temperature obtained by the light scanning is high, the light scanning crystallization method has advantages of high crystal growth rate and high quality of crystallization. In general, the crystallization method using light has technical merit that it may obtain better quality of crystallization compared to the method using a furnace. At the same time, the method has disadvantages in that it is difficult to adequately control the process conditions to obtain desirable results.

After the crystallization thermal treatment as described above is finished, a secondary thermal treatment may be performed to further improve the crystallization quality. For the secondary thermal treatment, a method of illuminating light such as excimer laser or a high-temperature thermal treatment using a furnace, RTA, microwave or the like may be used. It is known that the crystallization quality of a MILC layer is further improved by performing a secondary thermal treatment. Secondary thermal treatment is also effective to improve the quality of single crystalline silicon layer because the single crystalline silicon contains micro defects therein, and the secondary thermal treatment is effective to cure the defects. The crystalline region obtained by the MILC contains a plurality or crystal grains having needle-like shapes and the crystal grains are gathered to form a large crystalline region. Although the silicon crystallized by MILC typically has fewer defects compared to the poly-crystal silicon obtained by conventional SPC method, micro defects may still exit in the crystal structure. If the poly-crystal silicon obtained by the MILC is subjected to a secondary thermal treatment for 30 minutes at the temperature of 900° C., the electron mobility can be increased over 200 $cm^2/Vs$. If the device size is made small so that only a limited number of crystal grains exist in the channel region, the electron mobility may be increased up to about 500 $cm^2/Vs$. This shows that the micro defects in the poly-crystal silicon formed by the MILC can be greatly reduced by the secondary thermal treatment. Although the silicon layer crystallized by the method of the present invention can be composed of single crystal structure having an identical crystal orientation as opposed to the silicon layer crystallized by conventional MILC, there still might be minor defects or crystal grain boundaries depending on the crystallization time or conditions. Therefore, the characteristics of the crystalline thin film formed by the present invention also may be improved by the secondary thermal treatment.

When the substrate of a TFT is made of glass, a high temperature second thermal treatment using a temperature over the transformation temperature of glass may not be used. Thus, the second thermal treatment uses RTA or laser. The RTA method improves the crystal quality of the silicon layer by heating the silicon crystal for a short time at the temperature of 800–1100° C., which is much higher than the transformation temperature of glass about 600° C. For the thermal processing using a laser, it is effective to use continuous wave laser or excimer laser. As the wavelengths of excimer laser are typically in the range of 250–350 nm, energy absorption does not occur in the glass substrate but only in the silicon layer. Therefore, the excimer laser can perform the thermal treatment of the silicon layer momentarily. Although it is possible to momentarily heat the silicon layer over its melting temperature by controlling the laser energy, as the silicon crystal formed by the present invention has a high crystal quality even before the secondary heat treatment, it is more effective to increase its electron mobility to perform the secondary thermal treatment at a temperature lower than the melting temperature of silicon.

Performing the secondary thermal treatment to the MILC silicon layer having electron mobility of 80 $cm^2/Vs$ using a laser, the electron mobility may be increased over 200 $cm^2/Vs$. The energy of the laser used for the thermal treatment is preferably in the range of 200–300 $mJ/cm^2$. As the silicon layer obtained by the present invention originally has a high single crystal ratio, melting of the silicon by laser radiation could deteriorate rather than improve the crystal characteristics. Therefore, it is desirable that the laser used for the secondary thermal treatment has an energy level that does not heat the silicon layer above its melting temperature.

Figure 8D:
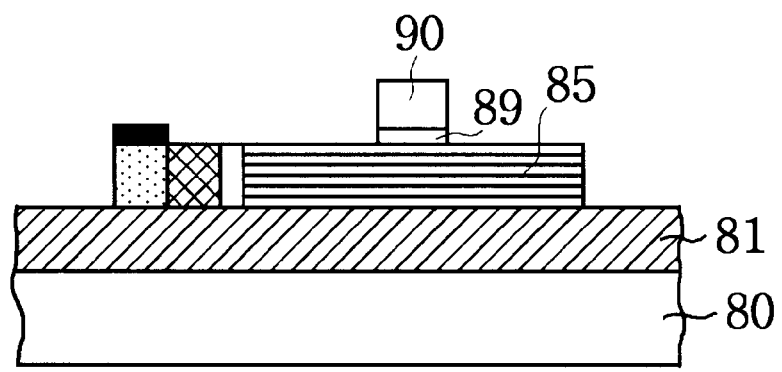
Figure 8D:
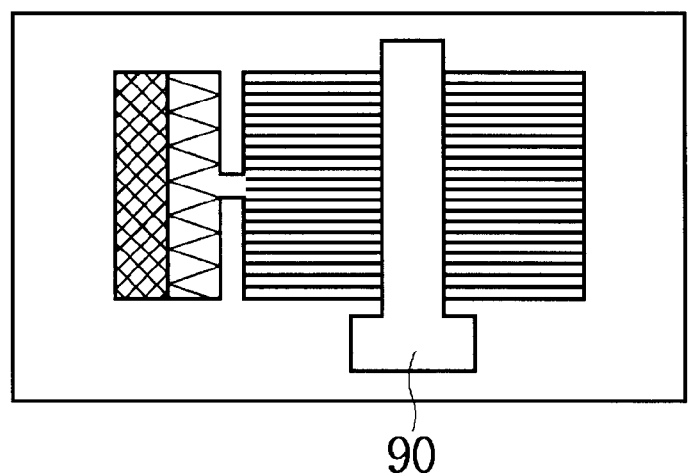
Figure 8E:
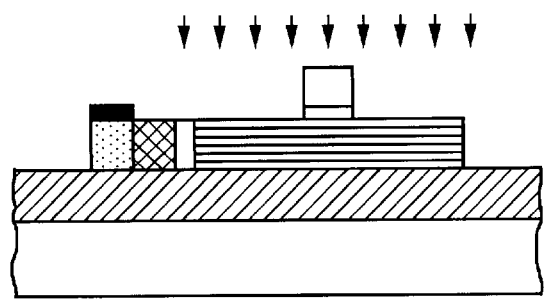

The active layer region 85 crystallized by the above method is used to form the active layer of a TFT. As shown in FIG. 8*d* and FIG. 8*d'*, a gate insulating layer 89 and a gate electrode 90 are formed on the crystallized active layer. The gate insulating layer 89 and the gate electrode 90 are deposited on the active layer using low pressure chemical vapor deposition, high pressure chemical vapor deposition, PE CVD, sputtering, evaporation and the like, and patterned into a desired shape using photoresist and the like. The gate electrode may be formed with metals such as Al, Au and Ag or with doped polysilicon. After forming the gate insulating layer and gate electrode, impurities are doped into the active layer to form the source and the drain region of the TFT as shown in FIG. 8*e*. In the doping process, impurities such as P and B are implanted into the active layer by ion mass doping or implanting method. After doping the impurities, thermal annealing is performed according to the conventional method to activate the dopants.

Figure 8F:
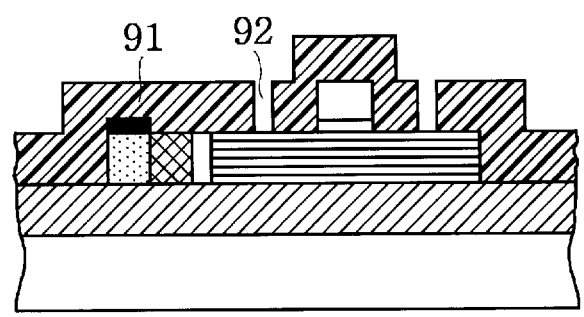
Figure 8G:
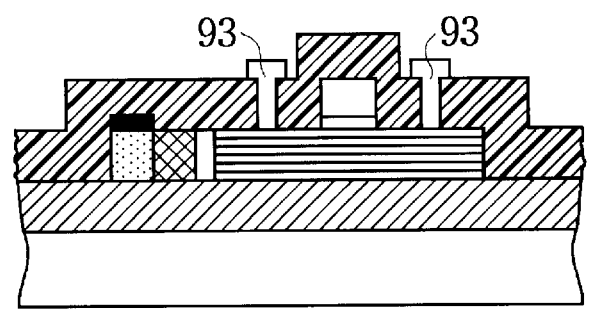

After the doping and the annealing of the active layer, as shown in FIG. 8*f*, a contact insulating layer 91 is formed on the substrate by using conventional methods and contact holes 92 are formed in the contact insulating layer 91. As the contact insulating layer, silicon oxides or silicon nitrides may be preferably used. The contact insulating layer is deposited by sputtering, evaporation, low pressure chemical vapor deposition, high pressure chemical vapor deposition, PE CVD and the like. Then, as shown in FIG. 8*g*, contact electrodes 93 for the source and the drain are formed by depositing conductive material and patterning and etching the deposited conductive material according to conventional methods. Thus, the fabrication of the thin film transistor is completed. When the completed TFT is used in the pixel electrodes of a display device such as LCD, the processes of fabricating the pixel electrodes are conducted after the fabrication of the TFT.

The TFT fabricated according to the present invention has significantly higher electron mobility and significantly lower leakage current as compared to the conventional poly-crystal silicon TFT. Also, the characteristics of the TFT according to the present invention are not deteriorated even after extended operation. In addition, fabricating a TFT with an active layer having the characteristics of single crystal, it is possible to integrate various semiconductor devices that may not be fabricated on poly-crystal silicon. Thus, it becomes possible to endow to the display devices including the TFT of the present invention with additional functions.

Below, other embodiments of the present invention will be explained based on the first embodiment explained above. The details of the technology of the following embodiments should be understood to be identical to those of the first embodiment otherwise specifically mentioned below.

Embodiment 2

Figure 9:
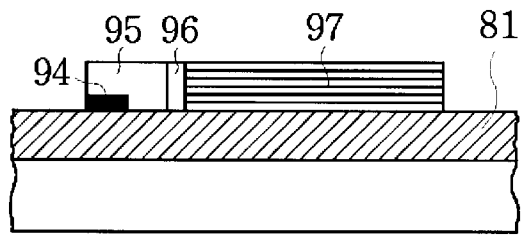
FIG. 9 is a diagram illustrating the process of fabricating a thin film transistor according to another embodiment of the present invention.

FIG. 9 is a partial cross-sectional view illustrating another method for fabricating a TFT according to the present invention. In the previous embodiment described referring to FIG. 8a to FIG. 8g, the crystallization source region 83, the crystal filtering channel 84 and the active layer region 85 are formed by patterning the amorphous silicon layer 82 and the MIC source metal layer 87 is formed over a portion of the crystallization source region 83 as shown in FIG. 8a and FIG. 8a'. However, in the embodiment of FIG. 9, a MIC source metal 94 is first formed on a bottom insulating layer 81 and an amorphous silicon layer 82 is deposited thereon. Then the amorphous silicon layer is patterned to form a crystallization source region 95, a crystal filtering channel 96 and an active layer region 97 respectively.

It is obvious that if the structure of FIG. 9 is subjected to the thermal crystallization process as described regarding embodiment 1, the same effects as explained above with respect to Embodiment 1 can be obtained. Then, a TFT is fabricated on the crystallized silicon layer as described above. Therefore, in the present invention, the order of the steps forming the MIC metal layer and the amorphous silicon layer can be switched within the scope of the present invention.

Embodiment 3

Although Embodiment 1 deposits the MIC source metal 87 on the MIC region 86 of the crystallization source region 83, it is also possible to implant the MIC source metal in the MIC region. MIC source metal such as Ni may be implanted only in the MIC region by implanting the source metal with photoresist mask formed on the crystallization source region to expose only the MIC region 86. The photoresist mask is removed after the metal implantation. Then, a TFT having a crystalline active layer can be fabricated through the same process as described above with respect to Embodiment 1.

Embodiment 4

Figure 10A:
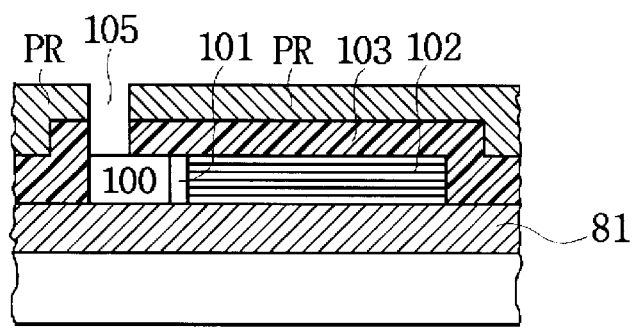
FIG. 10a to FIG. 10d are cross-sectional views illustrating the process of fabricating a thin film transistor according to another embodiment of the present invention.
Figure 10B:
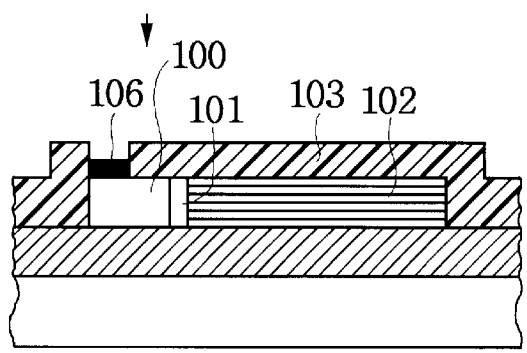
Figure 10C:
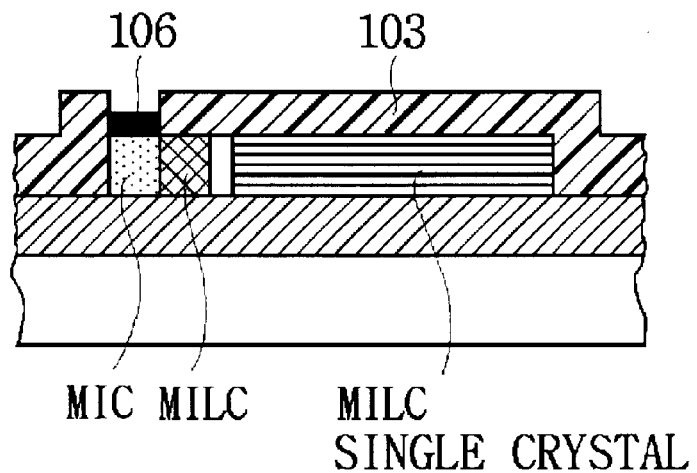

In Embodiment 1, the gate insulating layer 89 and the gate electrode 90 were formed after performing thermal treatment and depositing the MIC source metal 87 on the patterned amorphous silicon region 86 (see FIG. 8d). In the present embodiment, however, the amorphous silicon layer is first patterned to form the crystallization source region 100 and the crystal filtering channel 101 and the active layer region 102. Then, gate insulating layer 103 is formed on the amorphous silicon layer and photoresist PR is formed on the gate insulating layer 103. The photoresist is patterned to form the MIC region. Then, etching the gate insulating layer 103 covering the MIC region using the patterned photoresist as a mask, an aperture 105 is formed in the gate insulating layer 103 as shown in FIG. 10a. As shown in FIG. 10b, MIC source metal 106 is formed on the MIC region by forming a MIC source layer on the entire surface of the substrate by deposition or ion implantation and removing the photoresist. Then, the amorphous silicon layer is subjected to a crystallization thermal treatment as illustrated in FIG. 10c. The structure of FIG. 10d can be obtained by removing the photoresist and forming a gate electrode 107 of a desired shape on the gate insulating layer 103. Subsequently, a single crystalline TFT is fabricated according to the process as illustrated in FIG. 8e and below.

Embodiment 5

Figure 10D:
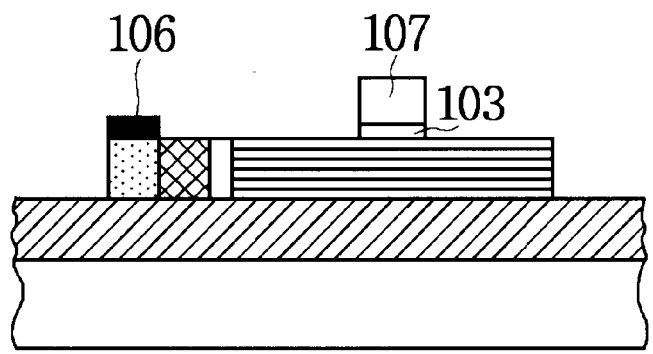

In this embodiment, the process of Embodiment 4 is changed so that the process of forming the gate electrode 107 as illustrated in FIG. 10d is performed prior to the crystallization thermal processing as illustrated in FIG. 10c. Since the crystallization thermal treatment is performed at relatively low temperature of 400–600° C., the crystallization process can be performed after forming the gate electrode.

Embodiment 6

Figure 11A:
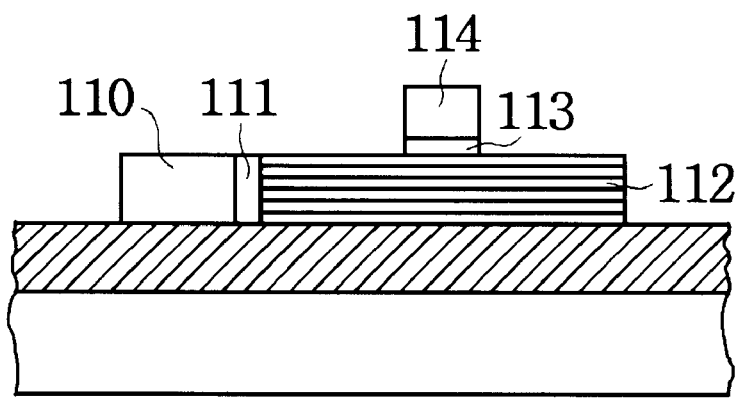
FIG. 11a and FIG. 11b are cross-sectional views illustrating the process of fabricating a thin film transistor according to another embodiment of the present invention.
Figure 11B:
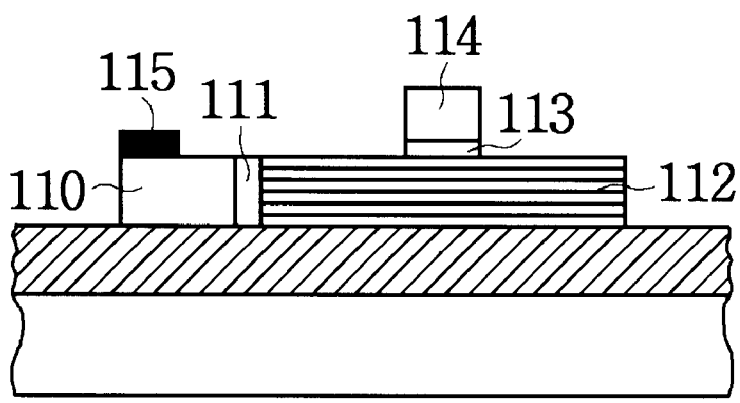

As shown in FIG. 11a, a gate insulating layer 113 and a gate electrode 114 are formed before MIC source metal is formed on the amorphous silicon layer patterned into a crystallization source region 110, a crystal filtering channel 111 and an active layer region 112. Subsequently, as shown in FIG. 11b, MIC source metal 115 is deposited on the MIC region of the crystallization source region 110 by the method as described with respect to Embodiment 1. After the MIC source metal is formed, the active layer region 112 is crystallized by a thermal treatment. Then, the crystallized active layer region 112 is doped with impurities using the gate electrode 114 as a mask. Thereafter, a TFT is fabricated according to the process as described above.

Embodiment 7

Figure 12A:
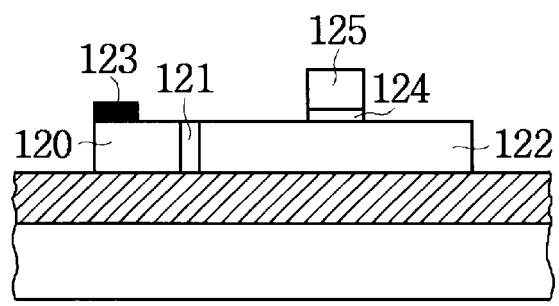
FIGS. 12a, 12b and 12c are cross-sectional views illustrating the process of fabricating a thin film transistor according to another embodiment of the present invention.
Figure 12B:
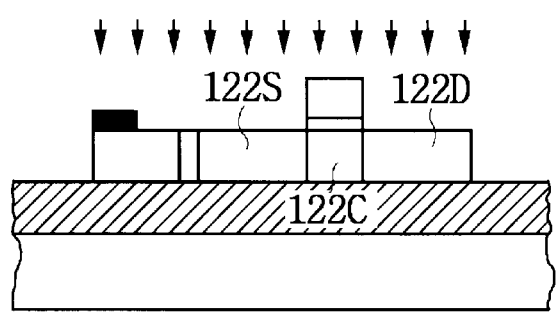
Figure 12C:
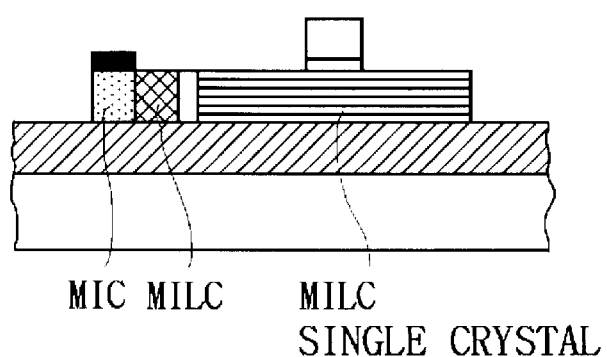

In this embodiment, MIC source metal 123, a gate insulating layer 124 and a gate electrode 125 are formed on the amorphous silicon layer that is patterned into a crystallization source region 120, a crystal filtering channel 121 and an active layer region 122 (see FIG. 12a). And a source region 122S, a channel region 122C and a drain region 122D are respectively formed by implanting impurity by the same method as explained referring to FIG. 8e (see FIG. 12b). Then, the active layer is crystallized by thermal treatment as explained above with respect to Embodiment 1 (see FIG. 12c).

As the conditions for crystallizing the active layer in the present invention are substantially similar to those for activating the impurity doped in the source region and the drain region, the activation of impurity can be conducted during the crystallization process of the active layer. Since this embodiment conducts the crystallization of the active layer and the activation of the dopant in a single process, this embodiment has an advantage of rendering the TFT fabrication process simpler.

Embodiment 8

Figure 13A:
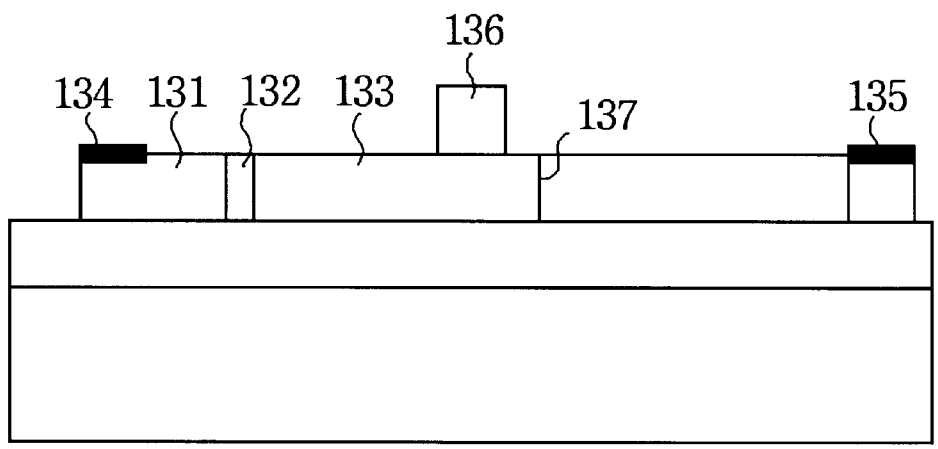
FIG. 13a and FIG. 13b are a cross-sectional view and a plane view respectively illustrating the process of fabricating a thin film transistor according to another embodiment of the present invention.
Figure 13B:
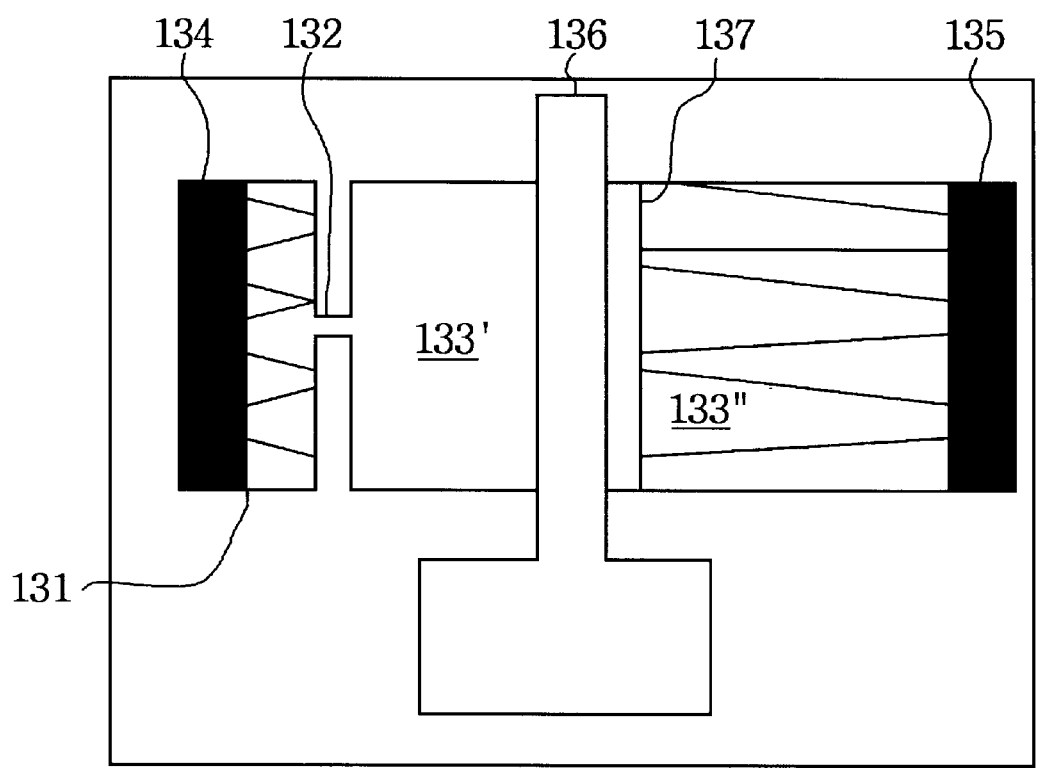

The FIG. 13a and FIG. 13b are respectively a partial cross-sectional view and a plan view of an embodiment which is characterized by forming the MIC source metal 134, 135 in the crystallization source region 131 and in a portion of the active layer region 133 opposing the crystallization source region. The MIC source metal is formed in the step corresponding to FIG. 8a and 8b of Embodiment 1. The gate electrode 136 can be formed prior to or after the crystallization thermal treatment of the active layer region 133 as described above. Conducting thermal treatment on the substrate after forming the MIC source metal 134 and 135, single crystallization is propagated in the active layer region 133' from the crystal filtering channel 132. At the same time, poly-crystallization by MILC is propagated in the active layer region 133" from the MIC source metal 135. The single crystallization region 133' and the poly-crystallization region 133" being grown in the opposite directions meet each other in the active layer region to form a crystal boundary 137. As described above, the crystal boundary 137 contains crystallization source metal. Thus, if the crystal boundary exists in the channel region, it deteriorates the operation characteristics of the TFT.

However, in this embodiment, the position of the channel region (that is, the position of the gate electrode 136) is adjusted so that the crystal boundary 137 is outside of the channel region and the channel region is located within the single crystal region 133'.

Then the channel region of the TFT can be formed on the single crystal region and the TFT may achieve the superb characteristics of a single crystal TFT. According to the present embodiment, the time for crystallizing the active layer region can be greatly reduced without sacrificing the performance of the TFT.

Embodiment 9

Figure 14:
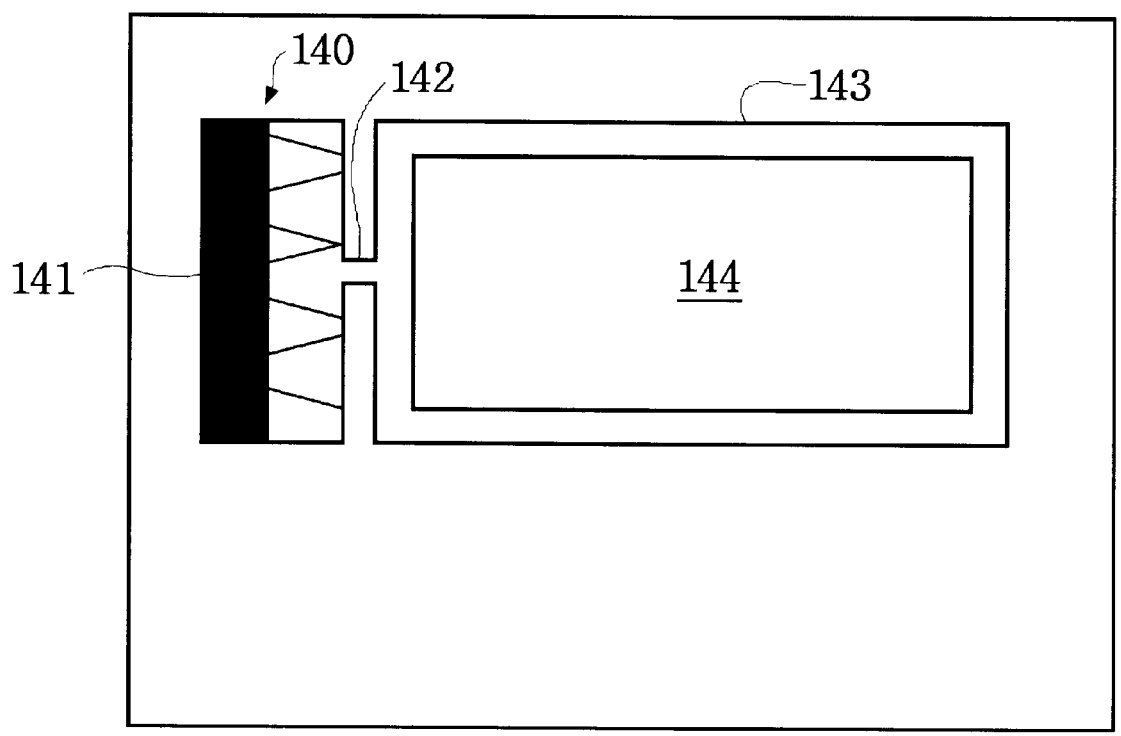
FIG. 14 is a plane view illustrating the process of fabricating a thin film transistor according to another embodiment of the present invention.

FIG. 14 illustrates an embodiment in which only the central region 144 of the active layer region 143 is used as the active layer of the TFT. The active layer region 143 in FIG. 14 is crystallized according to the method as illustrated in FIG. 8c and 8c' and the peripheral area of the actively layer region is removed by patterning the active layer region using conventional methods. The peripheral area of the active layer region is removed in this embodiment because the area may contain impurities such as the crystallization source metal or metal silicide, which may deteriorate the electrical characteristics of the crystallized active layer. If additional thermal treatment of the crystallized active layer region is not performed prior to the removal of the peripheral area, the crystal quality of the silicon layer can be significantly improved by performing additional thermal treatment using light radiation such as excimer laser, high temperature thermal processing using furnace, RTA, microwave and the like.

In the above, various structures of the crystal filter used in the present invention and the methods for fabricating a TFT according to the present invention were explained in detail. Applying the crystal filtering technique of the present invention to the crystallization of silicon layer using the MILC, the active layer of a TFT can be single crystallized at relatively low temperature of 400–600° C. Within the temperature range which does not cause damages to the substrate of display devices made of glass and the like, the low-temperature crystallization method of the present invention can simultaneously crystallize a plurality of substrates using a furnace. Thus, the method of the present invention effectively enhances the productivity of the TFT fabrication process.

As compared to the TFT using poly-crystal silicon made by conventional methods, the TFT fabricated by the present invention has significantly higher electron mobility and lower leakage current. In addition, the characteristics of the TFT do not deteriorate after extended operation. In particular, various semiconductor devices that could not been integrated into the conventional poly-crystal silicon layer may be integrated into the silicon layer crystallized according method of the present invention due to its excellent electrical characteristics such as the high electron mobility. Thus, it becomes possible to incorporate various additional functions to the display devices including the TFT according to the present invention. Due to the low leakage current and the high electron mobility, the use of the devices comprising the silicon layer crystallized according to the present invention can be broadened significantly. Although the device comprising the silicon layer formed by the present invention can be used in the driving circuit of LCD, pixel TFT, CPU and the like, the usage of the device is not limited to those. Particularly, the thin film transistor according to the present invention can be effectively used as the driving circuit and the pixel TFT of display devices such as LCD and OLED.

Although, the present invention has been described with respect to specific embodiments thereof, various changes and modifications and be carried out by those skilled in the art without departing from the scope of the invention. It is intended, therefore, that the present invention encompass such changes and modifications as fall within the scope of the appended claims.

What we claim:

1. A method for crystallizing a silicon layer to provide a crystalline active layer of a thin film transistor, comprising the steps of:
    (a) forming an amorphous silicon layer on a substrate;
    (b) forming a crystallization source region including MIC source metal, an active layer region and a crystal filtering channel connecting said crystallization source region and said active layer region by patterning said amorphous silicon layer; and
    (c) crystallizing said crystallization source region and said active layer region by conducting a thermal treatment to said patterned amorphous silicon layer,
    wherein the MIC source metal formed in the crystallization source region is separated from one end of the crystal filtering channel facing the crystallization source region a predetermined distance so that a single crystal grain among a plurality of crystal grains within the crystallization source region from the MIC source metal may enter the crystal filtering channel.

2. The method for crystallizing the silicon layer according to claim 1, wherein the width of said filtering channel is 0.1–20 μm.

3. The method for crystallizing the silicon layer according to claim 1, wherein said MIC source metal is formed on a portion of said crystallization source region being separated from said filtering channel by 2–50 μm.

4. The method for crystallizing the silicon layer according to claim 1, wherein said substrate is made of glass or quartz.

5. The method for crystallizing the silicon layer according to claim 1, further including a step of forming an insulating layer of silicon oxide or silicon nitride on said substrate prior to said step (a).

6. The method for crystallizing the silicon layer according to claim 1, wherein said MIC source metal contains at least one of Ni, Pd, Ti, Ag, Au, Al, Sri, Sb, Cu, Co, Cr, Mo, Ti, Tr, Ru, Rh, Cd, or Pt.

7. The method for crystallizing the silicon layer according to claim 6, wherein said MIC source metal is formed by evaporation, sputtering, CVD, coating or ion implantation.

8. The method for crystallizing the silicon layer according to claim 6, wherein said MIC source metal is formed with a thickness of 1~200 Å.

9. The method for crystallizing the silicon layer according to claim 1, wherein said thermal treatment of said step (c) is performed in a furnace.

10. The method for crystallizing the silicon layer according to claim 9, wherein said thermal treatment is performed at a temperature of 400–600° C.

11. The method for crystallizing the silicon layer according to claim 1, wherein said thermal treatment of said step (c) is performed using a light scanning method.

12. The method for crystallizing the silicon layer according to claim 11, wherein said light scanning is progressed from the portion of said crystallization source region where said MIC source metal is formed.

13. The method for crystallizing the silicon layer according to claim 1, further including a step of performing a secondary thermal treatment by excimer laser or RTA using a high-temperature lamp after said step (c).

14. The method for crystallizing the silicon layer according to claim 1, wherein said secondary thermal treatment is conducted at a temperature below the melting point of silicon.

15. The method for crystallizing the silicon layer according to claim 1, wherein said crystallization source region is poly-crystallized by said MIC source metal and single crystallization of said active layer region is progressed by the MILC propagating from said crystallization source region through said filtering channel during said thermal treatment of said step (c).

16. The method for crystallizing the silicon layer according to claim 15, wherein said thermal treatment is terminated when the single crystallization of said active layer region is progressed to a predetermined level.

17. The method for crystallizing the silicon layer according to claim 1, wherein said crystallization source region is formed on both sides of said active layer region and each said crystallization source region is connected to said active layer region by said filtering channel.

18. The method for crystallizing the silicon layer according to claim 1, wherein said crystallization source region has a multi-stage structure, in which two or more of said crystallization source regions are connected in series by said filtering channel.

19. The method for crystallizing the silicon layer according to claim 1, wherein said crystallization source region is formed on a lateral side of said active layer region.

20. The method for crystallizing the silicon layer according to claim 1, wherein said MIC metal formed in said crystallization source region has a shape of a wedge, a dot or a line extending toward said filtering channel.

21. A method for fabricating a thin film transistor including a crystallized silicon active layer comprising the steps of:
   (a) forming an amorphous silicon layer on a substrate;
   (b) forming a crystallization source region including MIC source metal, an active layer region and a crystal filtering channel connecting said crystallization source region and said active layer region by patterning said amorphous silicon layer;
   (c) crystallizing said crystallization source region and said active layer region by conducting a thermal treatment to said patterned amorphous silicon layer;
   (d) forming a gate insulating layer and a gate electrode on said active layer region;
   (e) doping impurity into said active layer region;
   (f) forming a contact insulating layer at least on said active layer region and at least one contact hole in said contact insulating layer; and
   (d) forming at least one contact electrode being electrically connected to said active layer region through said contact hole,
   wherein the MIC source metal formed in the crystallization source region is separated from one end of the crystal filtering channel facing the crystallization source region by a predetermined distance so that a single crystal grain among a plurality of crystal grains growing within the crystallization source region from the MIC source metal may enter the crystal filtering channel.

22. The method for fabricating the thin film transistor according to claim 21, wherein said step (d) is performed prior to said step (c).

23. The method for fabricating the thin film transistor according to claim 21, wherein said steps (d) and (e) are performed prior to said step (c).

24. The method for fabricating the thin film transistor according to claim 23, wherein the crystallization of said amorphous silicon layer and the activation of the impurity doped into said active layer region are simultaneously performed in said step (c).

25. The method for fabricating the thin film transistor according to claim 21, wherein said MIC source metal is formed on a portion of said crystallization source region and one end of said active layer region opposing said crystallization source region in said step (b).

26. The method for fabricating the thin film transistor according to claim 21, further including a step of patterning and removing the peripheral area of said active layer region after crystallizing said active layer region in said step (c).

27. The method for fabricating the thin film transistor according to any one of claims 21 to 26, wherein the width of said filtering channel is 0.1–20 $\mu$m.

28. The method for fabricating the thin film transistor according to any one of claims 21 to 26, wherein said MIC source metal is formed on a portion of said crystallization source region being separated from said filtering channel by 2–50 $\mu$m.

29. The method for fabricating the thin film transistor according to any one of claim 21 to 26, wherein said substrate is made of glass or quartz.

30. The method for fabricating the thin film transistor according to any one of claims 21 to 26, further including a step of forming an insulating layer with silicon oxide or silicon nitride on said substrate prior to said step (a).

31. The method for fabricating the thin film transistor according to any one of claims 21 to 26, wherein said MIC source metal contains at least one of Ni, Pd, Ti, Ag, Au, Al, Sri, Sb, Cu, Co, Cr, Mo, Ti, Tr, Ru, Rh, Cd, or Pt.

32. The method for fabricating the thin film transistor according to any one of claims 21 to 26, wherein said MIC source metal is formed by evaporation, sputtering, CVD, coating or ion implantation.

33. The method for fabricating the thin film transistor according to any one of claims 21 to 26, wherein said MIC source metal is formed with a thickness of 1–200 Å.

34. The method for fabricating the thin film transistor according to any one of claims 21 to 26, wherein said thermal treatment of said step (c) is performed in a furnace.

35. The method for fabricating the thin film transistor according to claim 34, wherein said thermal treatment is performed at a temperature of 400–600° C.

36. The method for fabricating the thin film transistor according to any one of claims 21 to 26, further including a step of performing a secondary thermal treatment by excimer laser or RTA using a high-temperature lamp after said step (c).

37. The method for fabricating the thin film transistor according to claim 36, wherein said secondary thermal treatment is performed at a temperature below the melting point of silicon.

38. The method for fabricating the thin film transistor according to any one of claims 21 to 26, wherein said crystallization source region is poly-crystallized by said MIC source metal and single crystallization of said active layer region is progressed by the MILC propagating from said crystallization source region through said filtering channel during said thermal treatment in said step (c).

39. The method for fabricating the thin film transistor according to claim 38, wherein said thermal treatment is terminated when the single crystallization of said active layer region is progressed to a predetermined level.

40. The method for fabricating the thin film transistor according to any one of claims 21 to 26, wherein said crystallization source region is formed on both sides of said active layer region and each of said crystallization source region is connected to said active layer region by said filtering channel.

41. The method for fabricating the thin film transistor according to any one of claims 21 to 26, wherein said crystallization source region has a multi-stage structure, in which two or more of said crystallization source regions are connected in series by said filtering channel.

42. The method for fabricating the thin film transistor according to any one of claims 21 to 26, wherein said crystallization source region is formed on a lateral side of said active layer region.

43. The method for fabricating the thin film transistor according to any one of claims 21 to 26, wherein said MIC metal formed in said crystallization source region has a shape of a wedge, a dot or a line extending toward said filtering channel.

44. The method for fabricating the thin film transistor according to any one of claims 21 to 26, wherein the thermal treatment of said step (c) is performed using a light scanning method.

45. The method for fabricating the thin film transistor according to any one of claims 21 to 26, wherein said light scanning is progressed from the portion of said crystallization source region where said MIC source metal is formed.

* * * * *